(12) United States Patent
Ahn et al.

(10) Patent No.: US 7,927,767 B2
(45) Date of Patent: Apr. 19, 2011

(54) REFLECTIVE PHOTOMASKS AND METHODS OF DETERMINING LAYER THICKNESSES OF THE SAME

(75) Inventors: Byoung-sup Ahn, Seongnam-si (KR);
Chang-kwon Hwangbo, Incheon (KR);
Sung-min Huh, Yongin-si (KR);
Hee-young Kang, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 153 days.

(21) Appl. No.: 12/232,959

(22) Filed: Sep. 26, 2008

(65) Prior Publication Data
US 2009/0170011 A1 Jul. 2, 2009

(30) Foreign Application Priority Data
Dec. 26, 2007 (KR) .................. 10-2007-0137883

(51) Int. Cl.
*G06F 1/00* (2006.01)
(52) U.S. Cl. ........................................................ 430/5
(58) Field of Classification Search ................ 430/5, 30; 378/35
See application file for complete search history.

(56) References Cited

U.S. PATENT DOCUMENTS

| | | | |
|---|---|---|---|
| 6,627,362 B2 * | 9/2003 | Stivers et al. ................. | 430/5 |
| 6,645,679 B1 | 11/2003 | La Fontaine et al. | |
| 7,682,758 B2 * | 3/2010 | Kim et al. ..................... | 430/5 |
| 2005/0084768 A1 | 4/2005 | Han et al. | |
| 2005/0208390 A1 | 9/2005 | Xiao | |

FOREIGN PATENT DOCUMENTS

KR   1020060069610    6/2006

* cited by examiner

*Primary Examiner* — Stephen Rosasco
(74) *Attorney, Agent, or Firm* — Harness, Dickey & Pierce, P.L.C.

(57) ABSTRACT

A reflective photomask and a method of determining or optimizing thicknesses of layers of the reflective photomask are provided. The reflective photomask may include a substrate, a reflective layer, an absorptive pattern, and a spacer. The substrate may include a reflective region and an absorptive region, the reflective layer may be formed between the reflective and absorptive regions, the absorptive pattern may be formed on the reflective layer corresponding to the reflective region, and the spacer may be formed at an upper portion, lower portion, or inside of the reflective layer so as to correspond to the reflective region.

20 Claims, 18 Drawing Sheets

REFLECTIVE PHOTOMASKS AND METHODS OF DETERMINING LAYER THICKNESSES OF THE SAME

PRIORITY STATEMENT

This application claims the benefit of Korean Patent Application No. 10-2007-0137883, filed on Dec. 26, 2007, in the Korean Intellectual Property Office, the disclosure of which is incorporated herein in its entirety by reference.

BACKGROUND

1. Field

Example embodiments relate to a photomask, for example, to a reflective photomask.

2. Description of the Related Art

Photomasks are widely used in manufacturing semiconductor devices. By transmitting through or reflecting a radiation from a photomask, an image may be formed on a semiconductor substrate. The radiation may be a light such as an ultraviolet light, a vacuum ultraviolet (VUV) light, a deep ultraviolet (DUV) light, or an extreme ultraviolet (EUV) light. The radiation may also be an X-ray radiation or an e-beam.

Among the various types of radiations mentioned above, EUV lights are effectively absorbed in most materials. Therefore, EUV light lithography, which uses EUV light as a light source and requires reflective photomasks for lithography, is well known as an advanced lithography technology, and reflective photomask for EUV light lithography has been widely used.

FIG. 1 shows a conventional reflective photomask 5 and a pattern formed on a semiconductor substrate 7 using the conventional reflective photomask 5.

Referring to FIG. 1, the conventional reflective photomask 5 may include a substrate 1, a reflective layer 2 formed on the substrate 1 to reflect EUV light, and a light absorption pattern 3 formed on the reflective layer 2. The light absorption pattern 3 may contain information regarding patterns to be transferred to the semiconductor substrate 7. The light absorption pattern 3 may absorb the incident EUV light. The EUV light may be incident or reflected from the reflective photomask 5 in a direction other than a perpendicular direction to a surface of the reflective layer 2. For example, EUV light may be incident or reflected from the surface of reflective layer 2 at an angle other than 90 degree. Accordingly, shadows may be formed as part of the incident EUV light may be blocked by the side walls of the light absorption pattern 3. As a result, the patterns S and L transferred to the semiconductor substrate 7 may be shifted in a predetermined direction, and this phenomenon is called a shadow effect.

SUMMARY

Example embodiments provide a reflective photomask that may reduce a shadow effect.

According to example embodiments, there is provided a reflective photomask. The reflective photomask may include a substrate, a reflective layer, an absorptive pattern, and a spacer. The substrate may include a reflective region and an absorptive region; the reflective layer may be formed on the reflective and absorptive regions; the absorptive pattern may be formed on the reflective layer corresponding to the absorptive region; and the spacer may locate at one of an upper portion, lower portion, or inside of the reflective layer so as to correspond to the reflective region.

The absorptive pattern may include an attenuation phase shift layer. The attenuation phase shift layer may include one of a tantalum nitride layer, a tantalum silicon nitride layer, a tantalum boron nitride layer, a tantalum silicon oxide layer, a chromium oxide layer, a chromium nitride layer, and an indium tin oxide layer. The absorptive pattern may also include an anti-reflection layer on the attenuation phase shift layer, wherein the anti-reflection layer includes one of an aluminum oxide layer and an indium tin oxide layer.

The absorptive pattern may be one of a tantalum oxide layer and aluminum oxide layer pair, a tantalum oxide layer and indium thin oxide layer pair, a tantalum oxide layer, aluminum oxide layer, and indium tin oxide layer stack, and a single indium tin oxide layer.

The spacer may have a thickness that creates a constructive interference between a light reflected from a top surface of the spacer and a light reflected from a bottom surface of the spacer.

The spacer may be a silicon layer and the spacer may be located above the reflective layer.

The reflective photomask may further include a capping layer above the reflective layer. The capping layer may be an uppermost layer at the reflective region and may be between the reflective layer and the absorptive pattern at the absorptive region. The capping layer may include one of a ruthenium layer, a silicon layer, and a carbon layer.

The reflective layer may have a trench at an upper portion of the absorptive region; and the absorptive pattern may be located in the trench.

According to an example embodiment, there is provided a method of determining or optimizing thicknesses of layers of a reflective photomask, the method may include providing a reflective photomask including a substrate, a reflective stack, and an absorptive stack, wherein the substrate may include a reflective region and an absorptive region, the reflective stack may include a reflective layer and a spacer at the reflective region, and the absorptive stack may include a reflective layer and an absorptive pattern formed on the reflective layer at the absorptive region.

The method may further include calculating a set of thickness values corresponding to every layer of the absorptive pattern, which may have a corresponding inspection contrast value equal to or greater than a reference value; calculating a plurality of exposure reflectance ratios and a phase shift values of the absorptive pattern with the set of thickness values, corresponding with a plurality of thicknesses of the spacer; extracting thicknesses of the spacer from the plurality of thicknesses of the spacer, wherein the corresponding exposure light reflectance ratio may be equal to or less than a reference value and the phase shift value may be within a reference range; and obtaining a maximum thickness from the extracted thicknesses of the spacer that may be equal to or less than an overall thickness of the absorptive pattern.

Calculating the thickness of each layer of the absorptive pattern may include setting an arbitrary thickness of each of the layers of the absorptive pattern; calculating an admittance value on a surface of the absorptive pattern for an inspection light based on the arbitrary thickness of each of the layers of the absorptive pattern; calculating an inspection contrast using the calculated admittance value; and comparing the inspection contrast with the reference value.

The spacer may be located beneath the reflective layer or inside of the reflective layer.

According to example embodiments, there is provided a method of determining or optimizing thicknesses of layers of a reflective photomask. The method may include providing a reflective photomask including a substrate, a reflective stack, and an absorptive stack, wherein the substrate may include a reflective region and an absorptive region, the reflective stack may include a reflective layer and a spacer at the reflective region, and the absorptive stack may include a reflective layer and an absorptive pattern formed on the reflective layer at the absorptive region.

The method may further include obtaining a plurality of exposure light reflectance of the reflective stack in accordance with a plurality of thicknesses of the spacer, respectively; extracting a final thickness of the spacer from the plurality of thickness of the spacer, so that the corresponding exposure light reflectance equal to or greater than a reference value; and obtaining a phase shift value within a reference range and an exposure light reflectance ratio equal to or less than a reference value, wherein the phase shift value and the exposure light reflectance ratio may be in accordance with a height difference between the absorptive and reflective stacks.

The method may further include calculating a phase shift value while varying a thickness of each layer of the absorptive pattern, and extracting a set of the thicknesses of each layer of the absorptive pattern, which may have the phase shift value within the reference range, wherein the absorptive pattern may be a multiple layer structure.

The spacer may be located above the reflective layer.

It is to be understood that both the foregoing general description and the following detailed description are intended to provide further explanation of example embodiments.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figure 1:
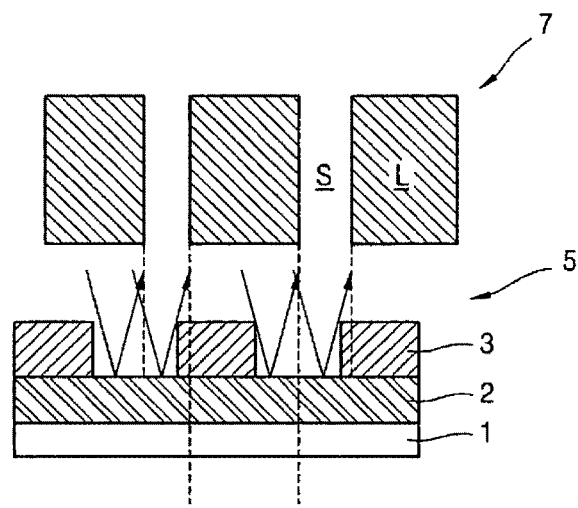
FIG. 1 is a cross-sectional view of a conventional reflective photomask and a pattern formed on a semiconductor substrate by the conventional reflective photomask.

Example embodiments will now be described more fully with reference to the accompanying drawings, in which example embodiments are shown. The example embodiments may, however, be embodied in many different forms and should not be construed as being limited to the example embodiments set forth herein; rather, these example embodiments are provided so that this disclosure will be thorough and complete, and will fully convey the concept of example embodiments to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

In the following example embodiments, reflective photomasks are described as being used in a photolithography process using extreme ultraviolet (EUV) light. However, the present disclosure is not limited to the example embodiments. For example, the reflective photomask of the present disclosure may collectively refer to photomask that transfers pattern information onto a wafer by reflecting light, not by transmitting light. The reflective photomask may also be referred to as a "reticle" or may include a reticle.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below.

Figure 2:
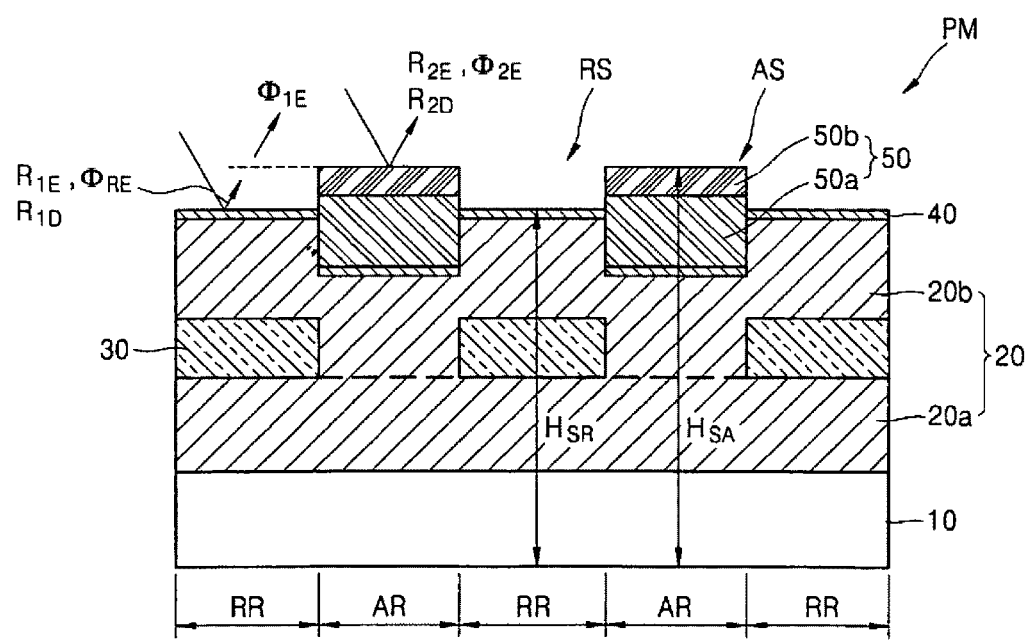
FIG. 2 is a cross-sectional view of a reflective photomask according to an example embodiment.

FIG. 2 is a cross-sectional view of a reflective photomask PM according to an example embodiment.

Referring to FIG. 2, the reflective photomask (PM) includes a substrate 10 and a reflective layer 20 formed on the substrate 10. The substrate 10 may be formed of a low thermal expansion material (LTEM), such as quartz, so as to minimize deformation of the substrate 10 when exposure light is absorbed in the substrate 10. The substrate 10 may include reflective regions RR and absorptive regions AR. The reflective layer 20 may be uniformly formed on the reflective and absorptive regions RR and AR of the substrate 10 with respect to thickness.

The reflective layer 20 may be a multi-layer reflector. For example, the multi-layer reflector may be formed by alternatively and repeatedly stacking two layers of materials having different optical constants and may maximize a light interference effect. The two alternating material layers may be chosen so that the difference between atomic numbers of the two material layers may be as large as possible in consideration of electron density. Each of the two material layers may include amorphous crystallinity. In order to maximize a reflectance of each of the material layers, a thickness of each of the material layers, e.g., a thickness of a unit reflective layer, may be ½ of a wavelength of the exposure light. For example, the exposure light may be an EUV light having a wavelength between 4-25 nm.

The reflective layer 20 may be a molybdenum/silicon (Mo/Si) multi-layer that includes at least one Mo layer and at least one Si layer that are alternately stacked on one another. Alternatively, the reflective layer 20 may be a molybdenum/beryllium (Mo/Be) multi-layer that includes at least one Mo layer and at least one Be layer that are alternately stacked on one another. When the reflective layer 20 is the Mo/Si multi-layer and the exposure light is an EUV light having a wavelength about 13.5 nm, the thicknesses of the Mo and Si layers may be about 2.9 nm and about 4.1 nm, respectively. When the reflective layer 20 includes 40 pairs of Mo and Si layers and another uppermost Si layer of about 4.1 nm, the reflectance of the reflective layer 20 may be maximized and/or optimized.

Referring to FIG. 2, an absorptive pattern 50 may be formed on the reflective layer 20 corresponding to the light absorptive regions AR of the substrate 10. The absorptive pattern 50 may absorb the exposure light.

According to an example embodiment, the absorptive pattern 50 may include an attenuation phase shift layer 50a. The attenuation phase shift layer 50a may partially absorb the exposure light and partially reflect the exposure light. The attenuation phase shift layer 50a may also phase-shift the incident exposure light, so that the exposure light partially reflected from the absorption region AR may have a desired interference with the exposure light reflected from the reflective region RR. The desired interference may occur along boundary of a reflected pattern from the reflective photomask PM. As a result, a sharpened pattern may be reflected. For example, when an incident exposure light with a phase $\phi_{1E}$ is reflected from the reflective photomask PM, the light reflected from the reflective region RR may substantially keep the amplitude and initial phase $\phi_{1E}$, but the light reflected from the absorption layer may be attenuated with a phase shifted to $\phi_{2E}$ (e.g. 180°). Therefore, a destructive interference may occur between the reflected lights along the boundary of the reflected pattern, where the light reflected by the reflective region RR and the out of phase light reflected by absorptive region AR meet. Thus a contrast of an edge of patterns formed on a semiconductor substrate may increase. Therefore, the reflective photomask PM may be classified as an attenuated phase shift mask. The attenuated phase shift layer 50a may include a tantalum nitride layer, a tantalum silicon nitride layer, a tantalum boron nitride layer, a tantalum silicon oxide layer, a chromium oxide layer, a chromium nitride layer, or an indium tin oxide layer.

According to an example embodiment, the absorptive pattern 50 may further include an anti-reflection layer 50b on the attenuated phase shift layer 50a. The anti-reflection layer 50b may partially absorb the exposure light and substantially absorb an inspection light to prevent the inspection light from being reflected. The inspection light is irradiated onto the reflective photomask PM in order to inspect a defect of a produced reflective photomask PM. The inspection light may have a longer wavelength than that of the exposure light. For example, when the exposure light is EUV light, the inspection light may be far-infrared light having a wavelength of 240-260 nm.

When the inspection light is incident on the anti-reflection layer 50b, part of the inspection light may be reflected from a top surface of the anti-reflection layer 50b, part of the light may penetrate into the antireflection 50b and be reflected back from inside the anti-reflection layer 50b, and part of the light may also be reflected by an interface between the anti-reflection layer 50b and the attenuation phase shift layer 50a. The various portions of the reflected inspection lights may have an destructive interference and thus overall amplitude of the inspection light may be substantially attenuated due to the destructive interference among the various portions of the reflected inspection lights. The anti-reflection layer 50b may be an aluminum oxide layer, an indium tin oxide layer, or a multiple layer thereof.

In an example embodiment, the absorptive pattern 50 may be a single layer functioning as both the attenuation phase shift layer 50a and the anti-reflection layer 50b. For example, the absorptive pattern 50 may be an indium tin oxide layer.

Referring to FIG. 2, a capping layer 40 may be formed on the reflective layer 20. In the reflective region RR, the capping layer 40 may be an uppermost layer. In the absorptive region AR, the capping layer 40 may be interposed between the reflective layer 20 and the absorptive pattern 50. The capping layer 40 may physically and/or chemically protect the reflective layer 20. For example, the capping layer 40 may have a relatively high etch selectivity relative to the absorptive pattern 50, thereby protecting the reflective layer 20 during an etching process or a repairing process for forming the absorptive pattern 50. In addition, when EUV light is irradiated, the capping layer 40 may prevent the reflective layer 20 from being oxidized. The capping layer 40 may include a ruthenium layer, a silicon layer, a carbon layer, or a combination thereof. When the capping layer 40 includes the ruthenium layer, a thickness of the capping layer 40 may be about 2 nm.

Referring to FIG. 2, a spacer 30 may be provided in the reflective region RR. The spacer 30 may be buried in the reflective layer 20 to correspond to the absorptive region AR of the substrate 10. For example, the reflective layer 20 may include a lower reflective layer 20a formed prior to the formation of the spacer 30 and an upper reflective layer 20b formed after the formation of the spacer 30. The lower reflective layer 20a may have substantially a same thickness as the upper reflective layer 20b at both the reflective and absorptive regions RR and AR. For example, the lower reflective layer 20a may include twenty pairs of Mo and Si layers and the upper reflective layer 20b may include twenty pairs of Mo and Si layers plus another uppermost Si layer. If the top layer of the lower reflective layer 20a is a Mo layer and the bottom layer of the upper reflective layer 20b is a Si layer, a bottom surface of the spacer 30 may contact the Mo layer and a top surface of the spacer 30 may contact the Si layer According to an example embodiment, the spacer 30 may also be formed under the reflective layer 20. For example, the spacer 30 may be formed between the substrate 10 of the reflective region RR and the reflective layer 20. Alternatively, the spacer 30 may also be formed on top of the reflective layer 20. For example, the spacer 30 may be formed between the reflective layer 20 and the capping layer 40. According to an example embodiment, the spacer 30 may also be formed on top of the capping layer 40.

The spacer 30 may have a thickness that creates a constructive interference between light reflected from a top surface of the spacer 20 and light reflected from a bottom surface of the spacer 30. The spacer 30 may be formed of a material that has a relatively small extinction coefficient (k) for the exposure light and thus rarely absorbs the exposure light and a similar refractive index (n) as the air, so that even when the spacer 30 is formed in the reflective layer 20, the spacer 30 may not decrease the reflectance of the reflective photomask PM. When the exposure light is EUV light, the spacer 30 may be formed of silicon, but is not limited thereto If all layers formed in the reflective region RR are referred to as a "reflective stack RS" and all layers formed in the absorptive region AR are referred to as an "absorptive stack AS", the spacer 30 may be used to reduce a height difference ($H_{SA}$–$H_{SR}$) between the absorptive and reflective stacks AS and RS, so as to reduce the shadow effect caused by the absorptive pattern 50

Referring to FIG. 2, $R_{2E}$ and $\phi_{2E}$ denote a reflectance of the exposure light incident on the absorptive stack AS and a phase of the exposure light reflected therefrom, respectively. $R_{2D}$ denotes a reflectance of the inspection light incident on the absorptive stack AS. Similarly, $R_{1E}$ denotes a reflectance of the exposure light incident on the reflective stack RS. The reflected light initially may have a phase $\phi_{RE}$ if taking the surface of the reflective stack RS as a reference position. But when taking the height of the top surface of the reflective stack RS as a reference height (the dash line shown in FIG. 2) the reflected light may have a phase $\phi_{1E}$. Furthermore, $R_{1D}$ indicates a reflectance of the inspection light incident on the reflective stack RS.

When the reflective photomask PM is an attenuated phase shift mask, i) a phase shift value ($\Phi_{1E}$-$\Phi_{2E}$) for the exposure light may be about 180° and a reflectance ratio ($R_{2E}/R_{1E}$) for the exposure light may be less than 0.1. Accordingly, a destructive interference may occur between the two reflected lights at a boundary portion where the phases are shifted from $\Phi_{1E}$ to $\Phi_{2E}$, and thus a contrast at an edge of the patterns formed on the semiconductor substrate may be increased. As a result, finer and/or sharper patterns may be formed on the semiconductor substrate. When a reflectance ratio for the exposure light is less than 0.1, the reflected light from the absorptive stack AS may not form a pattern on the semiconductor substrate. In addition, a contrast ratio (Ci, ($R_{1D}$–$R_{2D}$)/($R_{1D}$+$R_{2D}$)) for the inspection light may be 90% or more. Accordingly, a defect of the reflective photomask PM may be more easily detected during a mask inspection process. However, in order to satisfy the conditions i), and iii), the thickness of each layer must be determined or optimized.

Figure 3:
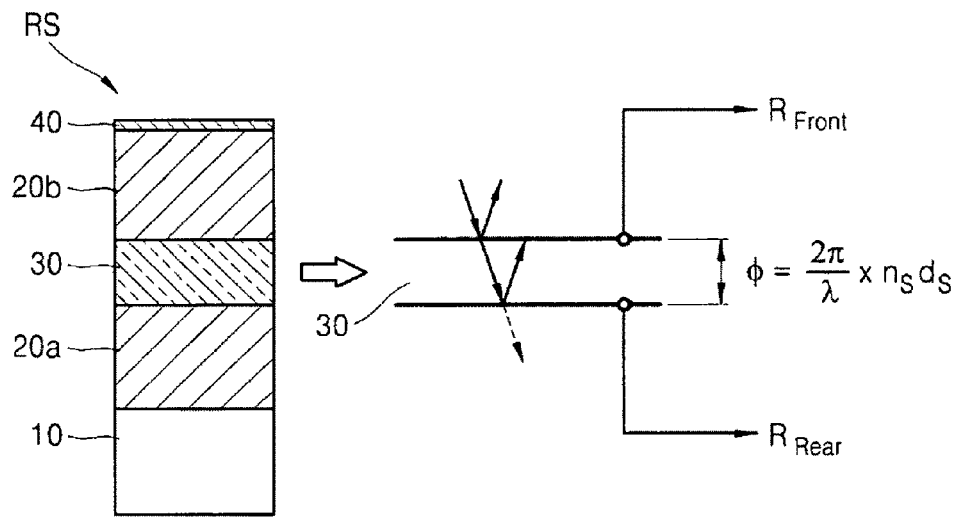
FIG. 3 is a schematic view of a reflective stack with a spacer inserted, and the reflective stack is simplified as a Fabry-Perot interferometer.

FIG. 3 is a schematic view of the reflective stack RS, in which the spacer 30 is inserted and which is simplified as a Fabry-Perot interferometer.

Referring to FIG. 3, the reflective stack RS may be simplified as the Fabry-Perot interferometer. The lower surface of the higher reflective layer 20b may be a front mirror; the upper surface of the lower reflective layer 20a may be a rear mirror, and the spacer 30 may be located between front and rear mirrors that face each other. A reflectance $R_{front}$ of the front mirror and a reflectance $R_{rear}$ of the rear mirror may vary in accordance with an insertion location of the spacer 30. Therefore, the reflectance $R_{1E}$ and $R_{1D}$ of the reflective stack RS may vary in accordance with the insertion location of the spacer 30. An optical thickness $\phi$ of the spacer 30 may vary in accordance with a thickness ds of the spacer 30. Therefore, the phase $\phi_{1E}$ of the reflected light from the reflective stack RS may vary in accordance with the thickness ds of the spacer 30. The reference ns indicates a refractive index of the spacer 30. Conclusively, the reflectance $R_{1E}$ and $R_{1D}$ of the reflective stack RS and the phase $\phi_{1E}$ of the reflected light from the reflective stack RS may vary in accordance with the location and thickness of the spacer 30.

Figure 4A:
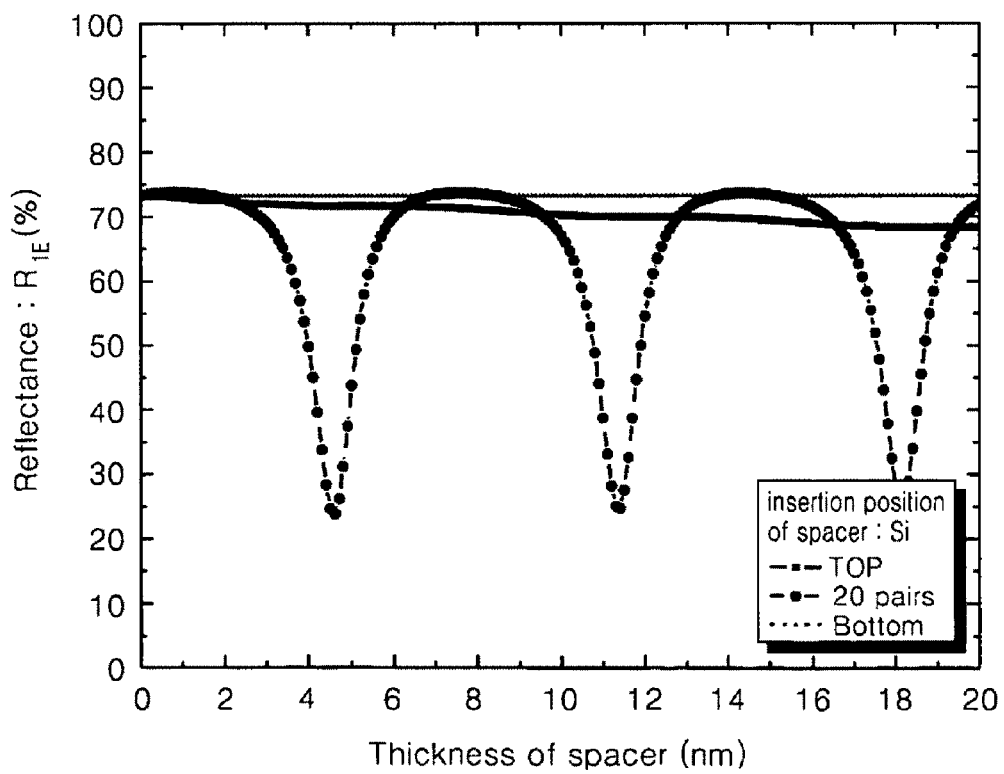
FIG. 4A is a graph illustrating a variation of a reflectance $R_{1E}$ in accordance with a thickness of a spacer.
Figure 4B:
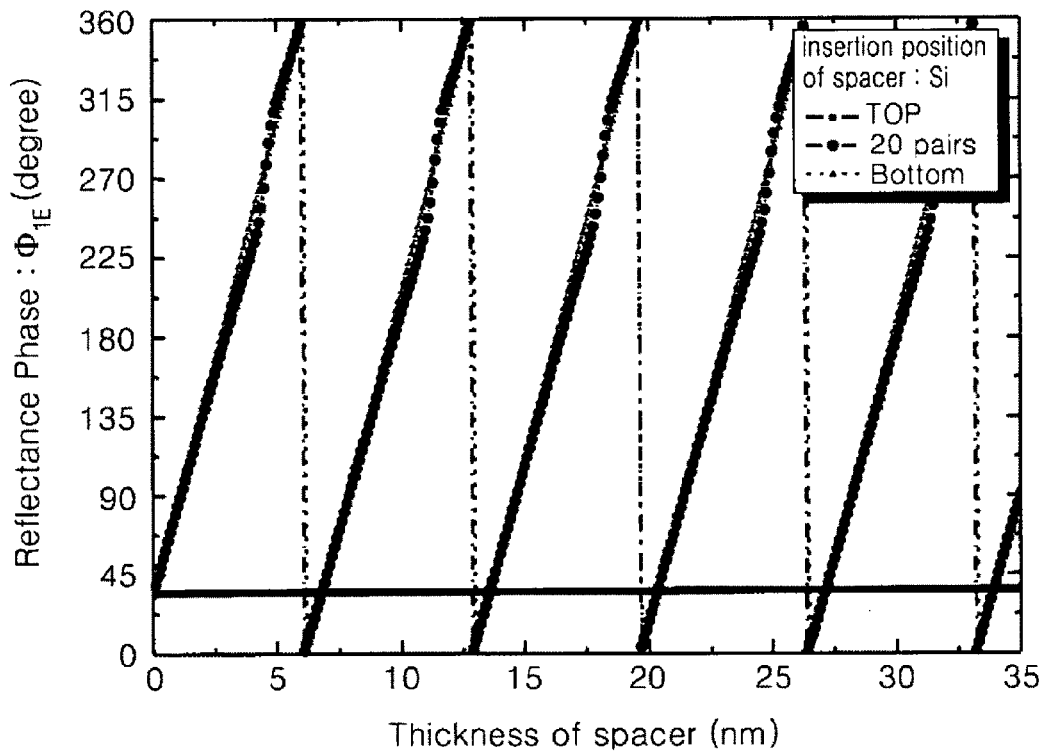
FIG. 4B is a graph illustrating a variation of a phase value $\phi_{1E}$ of reflected light in accordance with a thickness of a spacer.

FIG. 4A is a graph illustrating a variation of the reflectance $R_{1E}$ in accordance with the thickness of the spacer 30, and FIG. 4B is a graph illustrating a variation of the phase $\phi_{1E}$ of the reflected light in accordance with the thickness of the spacer 30. The wavelength of the exposure light is 13.5 nm.

Referring to FIG. 4A, the thicknesses of the spacer 30 may correspond to an optical thickness of $\lambda/2$ regardless of the location of the spacer 30 to obtain the highest exposure light reflectance $R_{1E}$. In addition, when the spacer 30 is located underneath the reflective layer 20 or located above the reflective layer 20, the exposure light reflectance $R_{1E}$ may be high regardless of the thickness of the spacer 30.

Referring to FIG. 4B, when the thicknesses of the spacer 30 corresponds to an optical thickness of $\lambda/2$ regardless of the location of the spacer 30, a constant phase $\phi_{1E}$ may be obtained. In addition, when the spacer 30 is located above the reflective layer 20, the phase $\phi_{1E}$ may be constant regardless of the thickness of the spacer 30. When the spacer 30 is located underneath the reflective layer 20, the phase $\phi_{1E}$ may linearly increase as the optical thickness of the spacer 30 increases.

Figure 5:
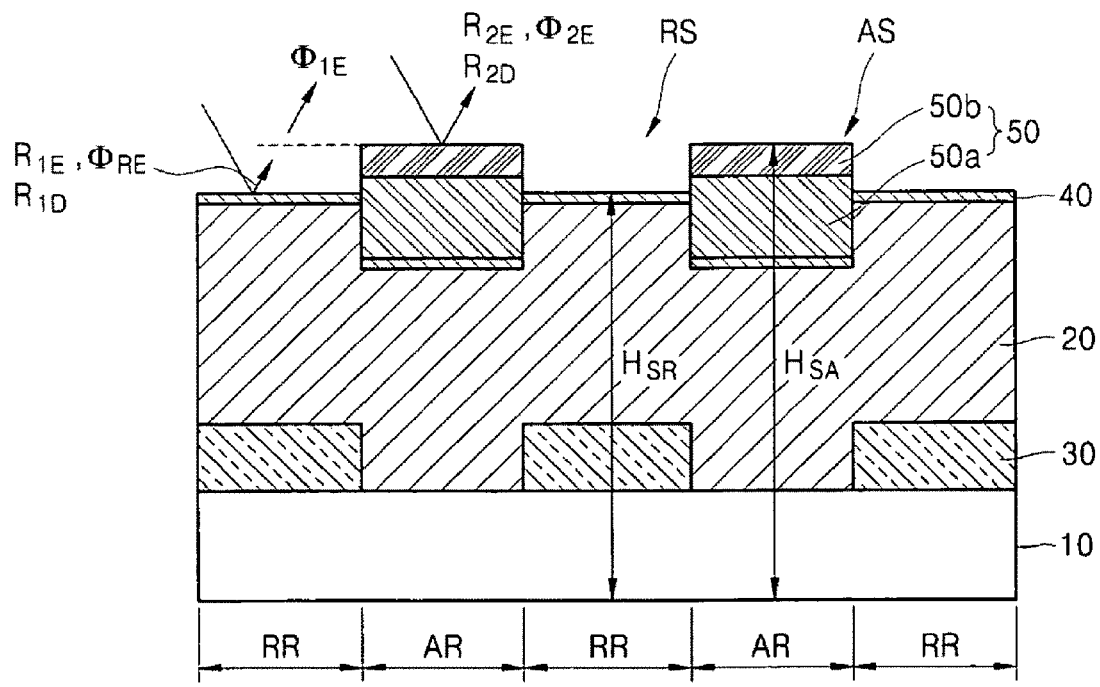
FIG. 5 is a cross-sectional view of a reflective photomask according to an example embodiment.

FIG. 5 is a cross-sectional view of a reflective photomask according to an example embodiment. The reflective photomask may be similar to that of FIG. 2 except that the spacer 30 may be formed at a lower portion of the reflective layer 20, for example, between the reflective region RR of the substrate 10 and the reflective layer 20.

Figure 6:
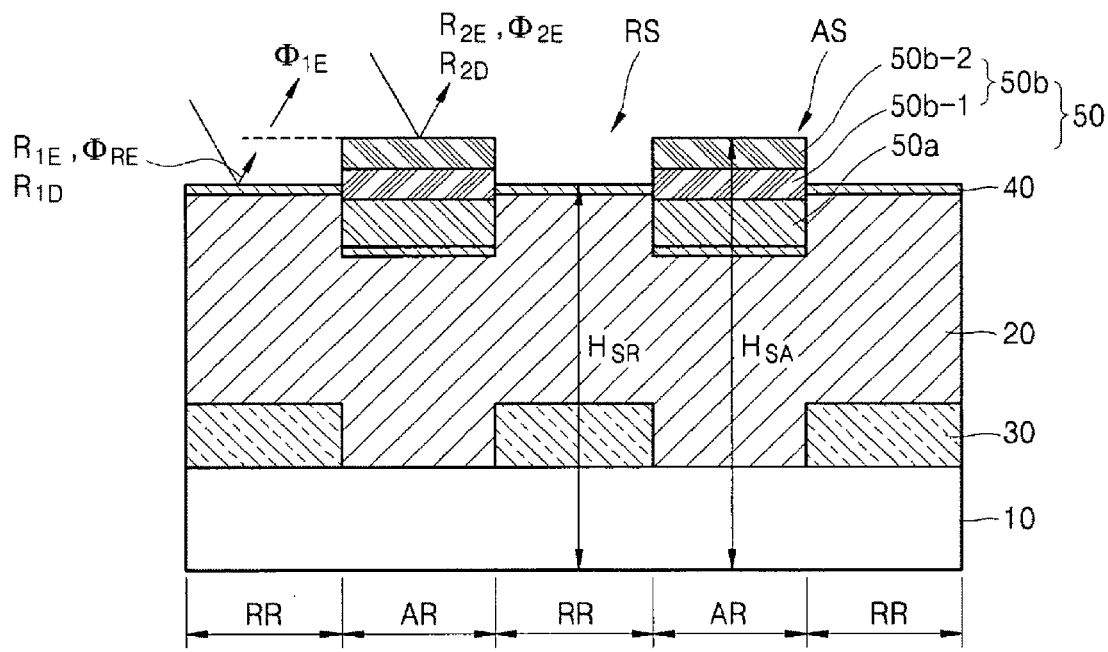
FIG. 6 is a cross-sectional view of a reflective photomask according to an example embodiment.
Figure 7:
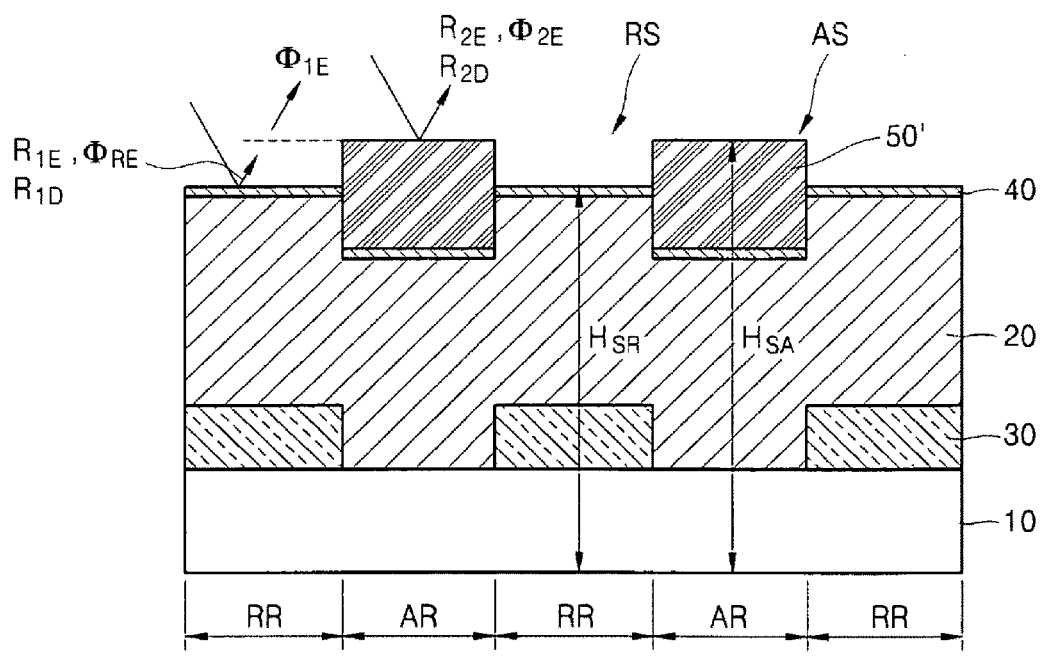
FIG. 7 is a cross-sectional view of a reflective photomask according to an example embodiment.

FIG. 6 is a cross-sectional view of a reflective photomask according to an example embodiment. The reflective photomask may be similar to that of FIG. 2 except that the spacer 30 may be located at a lower portion of the reflective layer 20, for example, between the reflective region RR of the substrate 10 and the reflective layer 20, and the absorptive pattern 50 may include an attenuation phase shift layer 50a and an anti-reflection layer 50b. The anti-reflection layer 50b may be a dual-layer having a lower anti-reflection layer 50b-1 and an upper anti-reflection layer 50b-2. When the inspection light is incident on the anti-reflection layer 50b, light reflected from a surface of the anti-reflection layer 50b (e.g., from a surface of the upper anti-reflection layer 50b-2) and light reflected from a surface of the upper anti-reflection layer 50b-2, may have a phase difference about 180° from each other. Therefore, a destructive interference may occur. For example, the inspection lights reflected from an interface between the upper anti-reflection layer 50b-2 and the lower anti-reflection layer 5b-1 may have a phase difference of about 180° from each other and the phase difference may thus disappear and/or may be substantially attenuated by a destructive interference therebetween. The lower anti-reflection layer 50b-1 may be an aluminum oxide layer and the upper anti-reflection layer 50b-2 may be an indium tin oxide layer FIG. 7 is a cross-sectional view of a reflective photomask according to an example embodiment. The reflective photomask may be similar to that of FIG. 2 except that the spacer 30 may be located at a lower portion of the reflective layer 20, for example, between the reflective region RR of the substrate 10 and the reflective layer 20, and an absorptive pattern 50' may be a single layer functioning as both an attenuation phase shift layer and an anti-reflection layer. For example, the absorptive pattern 50' may be an indium tin oxide layer.

Figure 8:
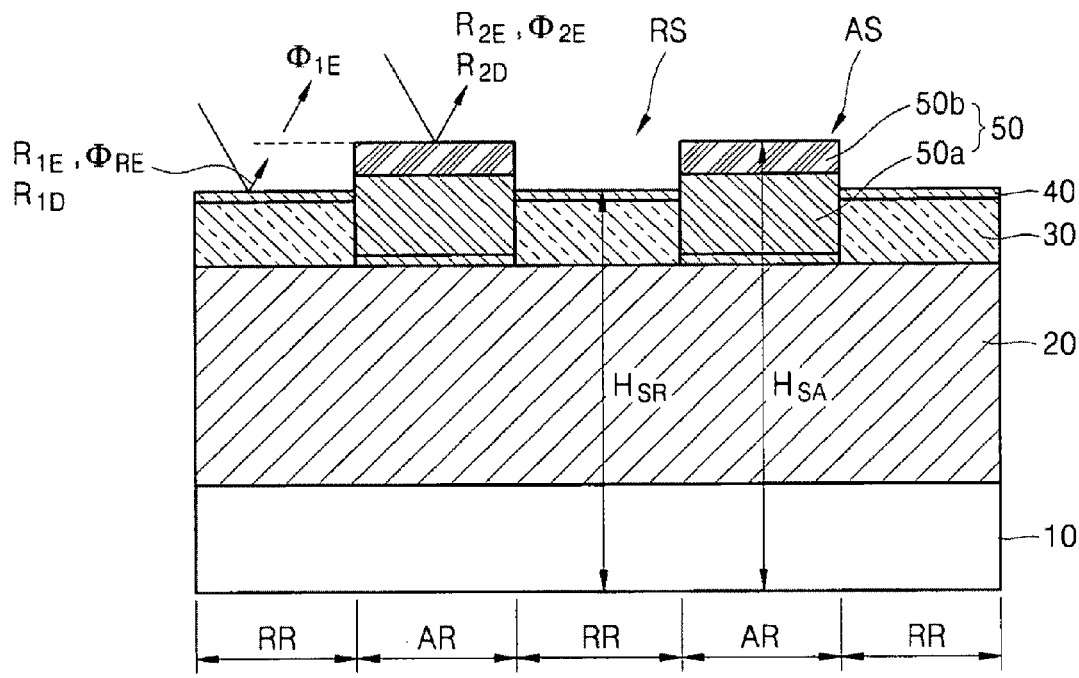
FIG. 8 is a cross-sectional view of a reflective photomask according to an example embodiment.

FIG. 8 is a sectional view of a reflective photomask according to an example embodiment. The reflective photomask may be similar to that of FIG. 2 except that the spacer 30 may be located on top of the reflective layer 20. For example, the spacer 30 may be between the reflective layer 20 and the capping layer 40.

Figure 9:
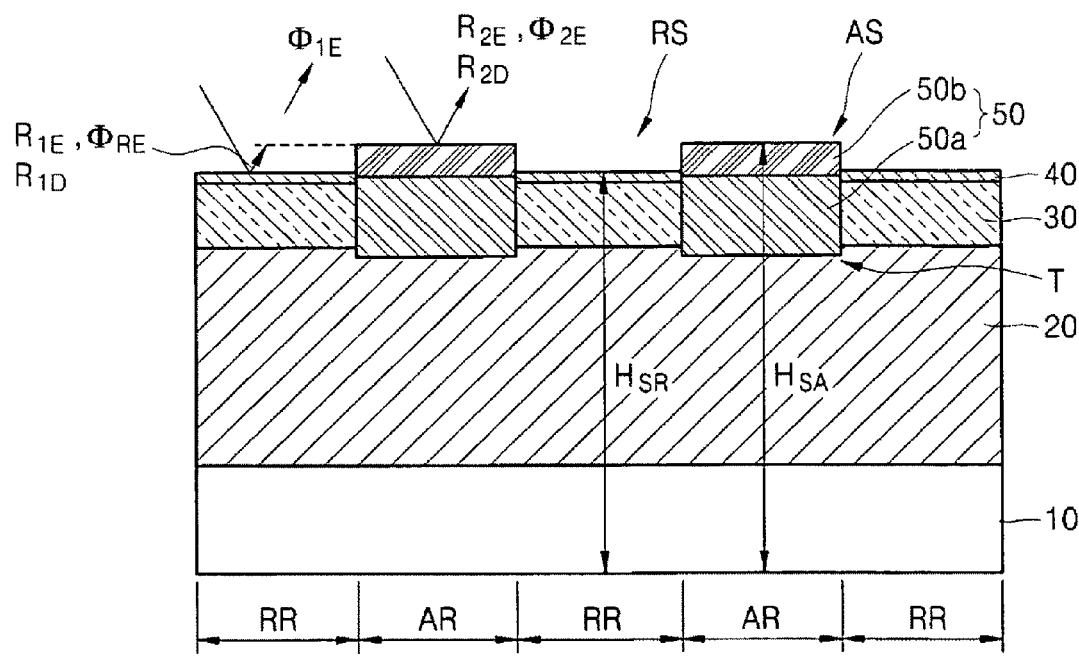
FIG. 9 is a cross-sectional view of a reflective photomask according to an example embodiment.

FIG. 9 is a cross-sectional view of a reflective photomask according to an example embodiment. The reflective photomask may be similar to that of FIG. 2 except that the spacer 30 may be located on top of the reflective layer 20. For example, the spacer 30 may be between the reflective layer 20 and the capping layer 40. A trench T may be formed in an upper portion of the reflective layer 20 in the absorptive region AR. A lower portion of the absorptive pattern 50 may be located in the trench T. In addition, the reflective photomask may not have the capping layer 40 between the reflective layer 20 and the absorptive pattern 50.

Figure 10:
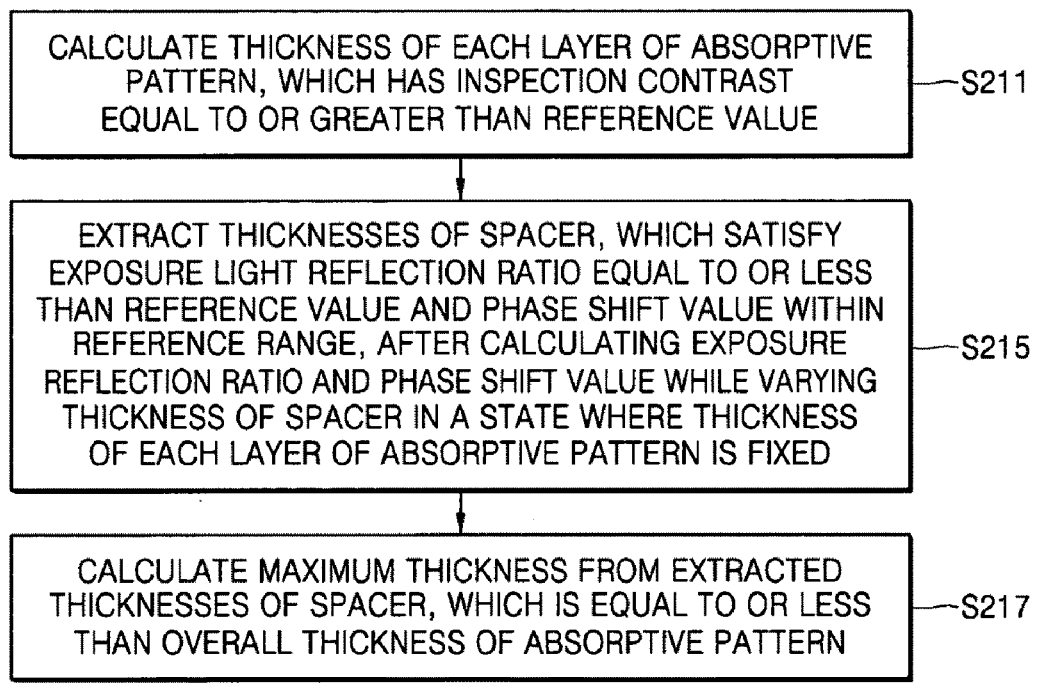
FIG. 10 is a flowchart of a method of determining or optimizing thicknesses of layers of a photomask according to an example embodiment.

FIG. 10 is a flowchart of a method of determining or optimizing thicknesses of layers of a reflective photomask, according to an example embodiment. Particularly, FIG. 10 illustrates a method of determining or optimizing the thicknesses of the absorptive pattern 50 and the spacer 30 of one of the reflective photomasks of FIGS. 2 and 5 through 9. The method of example embodiment may be applied to example embodiments that the spacer 30 is inserted in the reflective layer 20, located beneath the reflective layer 20, or located on top of the reflective layer 20. For example, the method of this embodiment may be applied to an example embodiment that the spacer 30 is inserted in the reflective layer 20 or located beneath the reflective layer 20. For convenience, the method will be described with reference to the reflective photomask of FIG. 5.

Referring to FIGS. 5 and 10, the thicknesses of all the layers of the absorptive pattern 50 having an inspection contrast higher than a reference value may be calculated (S211). The inspection contrast may be calculated according to Equation 1, and the reference value of the inspection contrast may be 90%.

$$C_i = \frac{R_{1D} - R_{2D}}{R_{1D} + R_{2D}} \quad \text{[Equation 1]}$$

where, $R_{1D}$ and $R_{2D}$ are reflectance of the reflective stack RS and absorptive stack AS with respect to the inspection light.

First, the layer thicknesses of all the layers of the absorptive pattern 50 may be arbitrarily set. For example, the thicknesses of a tantalum nitride layer and an aluminum oxide layer may be arbitrarily set when the absorptive pattern 50 includes the tantalum nitride layer as the attenuation phase shift layer 50a and the aluminum oxide layer as the anti-reflection layer 50b.

An admittance diagram of the absorptive stack AS with respect to the inspection light may then be obtained based on the arbitrary thicknesses of all the layers of the absorptive pattern 50. A final admittance value Y (e.g., a surface admittance value of the absorptive pattern 50) may be obtained from the admittance diagram. The final admittance value Y may be applied to Equation 2 so as to calculate the reflectance $R_{2D}$ of the absorptive stack AS.

$$R = \left|\frac{1-Y}{1+Y}\right|^2 \quad \text{[Equation 2]}$$

where, Y is the surface admittance value and R is the reflectance.

According to Equation 2, when the surface admittance value of the absorptive stack AS is the same as that of vacuum or air (1.0, 0.0), which is an external medium, the reflectance R may be 0%. Accordingly, the absorptive stack AS may have a perfect non-reflection property. Therefore, the surface admittance value Y may approximate to (1.0, 0.0).

The inspection light reflectance $R_{1D}$ of the reflective stack RS may be uniform regardless of the location or thickness of the spacer 30.

Next, the inspection contrast may be calculated by applying the reflectance $R_{2D}$ and $R_{1D}$ of the absorptive and reflective stacks AS and RS to Equation 1. If the inspection contrast Ci is 90% or more, the arbitrarily set layer thicknesses of the absorptive pattern 50 may be used as the final thicknesses. If the inspection contrast Ci is less than 90%, the layer thicknesses of the absorptive pattern 50 may be set again and the above processes may be repeated again till the final layer thicknesses of the absorptive pattern 50 have the inspection contrast of 90% or more.

By varying the thickness of the spacer 30 and keeping the layer thicknesses of the absorptive pattern 50 to the final layer thickness, reflectance ratios ($R_{2E}/R_{1E}$) and phase shift values ($\Delta\phi_E=\phi_{1E}-\phi_{2E}$) of the absorptive and reflective stacks AS and RS with respect to the exposure light may be calculated. The thickness values of the spacer 30 may be extracted (S215) if the phase shift value ($\Delta\phi_E$) is within a reference range and the reflectance ratio ($R_{2E}/R_{1E}$) for the exposure light is less than a reference value. The reference value of the reflectance ratio ($R_{2E}/R_{1E}$) for the exposure light may be 0.1 and the reference range of the phase shift value ($\Delta\phi_E$) may be 180±5°.

Next, among the extracted thickness values of the spacer 30, a maximum thickness equal to or less than an overall thickness of the absorptive pattern 50 may be selected (S217).

Figure 11A:
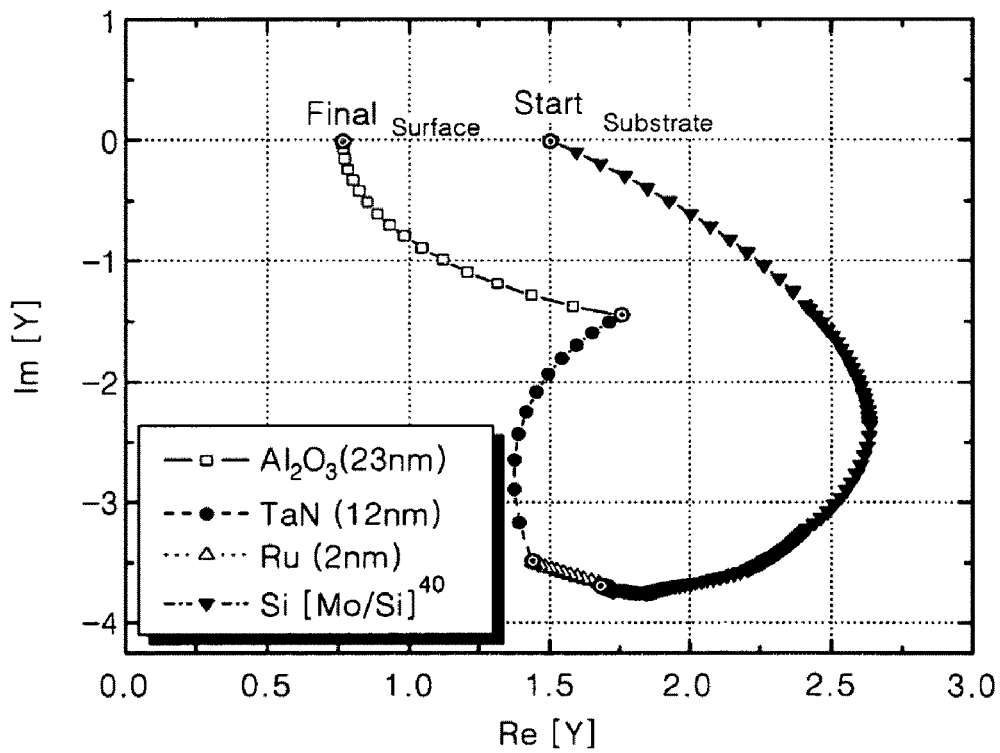
FIGS. 11A through 11D are graphs associated with a method of determining or optimizing thicknesses of layers of a reflective photomask, according to an example embodiment.
Figure 11B:
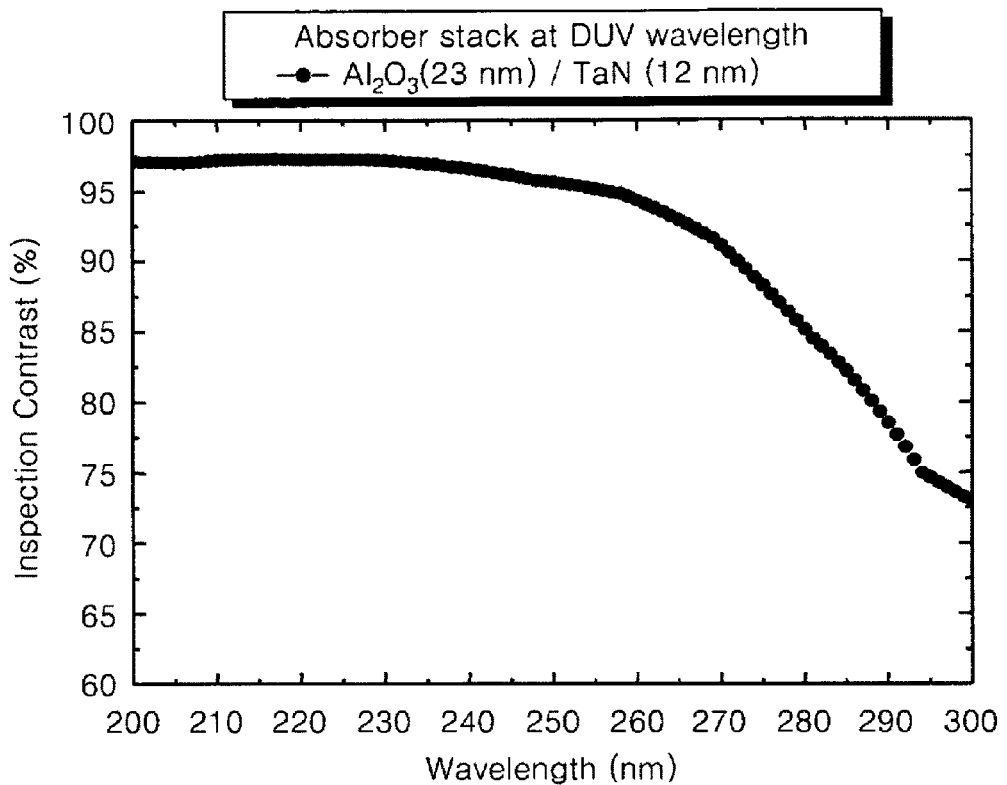
Figure 11C:
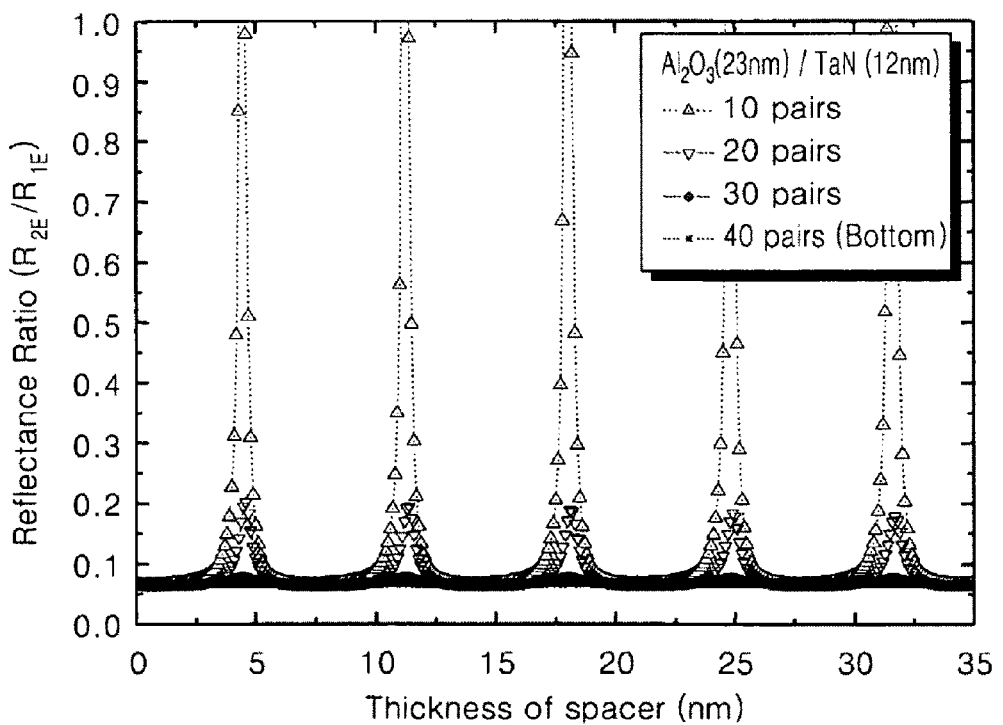
Figure 11D:
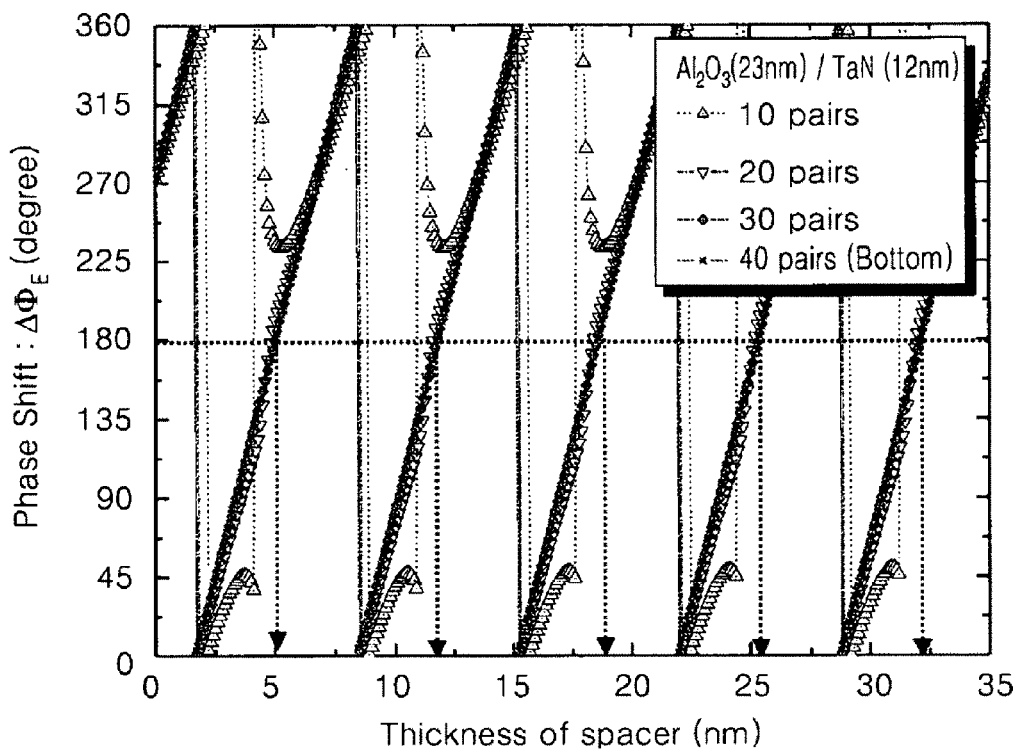

FIGS. 11A through 11D are graphs associated with a method of determining or optimizing thicknesses of layers of a reflective photomask, according to an example embodiment. Specifically, FIG. 11A is a graph of an example of the admittance diagram of the absorptive stack for the inspection light. FIG. 11B is a graph of an example of the inspection contrast in accordance with the wavelength of the inspection light. FIG. 11C is a graph of an example of the reflectance ratio ($R_{2E}/R_{1E}$) for the exposure light in accordance with the thickness of the spacer. FIG. 11D is a graph of an example of the phase shift value ($\Delta\phi_E$) in accordance with the thickness of the spacer 30.

Referring to FIG. 11A, when the absorptive stack includes a reflective layer formed with 40 pairs of Mo and Si layers plus another uppermost Si layer, a 2 nm ruthenium layer (e.g., a capping layer), a 12 nm tantalum nitride layer (e.g., an attenuation phase shift layer), and a 23 nm aluminum oxide layer (e.g., an anti-reflection layer), which are stacked on a substrate in this order, and a wavelength of the inspection light is 257 nm, the surface admittance value of the absorptive stack is (0.766, −0.029). When the surface admittance value of the absorptive stack is applied to Equation 2, the reflectance $R_{2D}$ of the absorptive stack for the inspection light becomes 1.78%.

Further, when the reflective stack includes, on a substrate, a reflective layer formed with 40 pairs of Mo and Si layers plus another uppermost Si layer, a 2 nm ruthenium layer (e.g., a capping layer), and a silicon layer (e.g., a spacer) formed between the substrate and the capping layer, and a wavelength of the inspection light is 257 nm, the reflectance $R_{1D}$ of the reflective stack for the inspection light becomes 68.4% regardless of the location or thickness of the spacer.

When the reflectance $R_{2D}$ (1.78%) of the absorptive stack and the reflectance $R_{1D}$ (68.4%) of the reflective stack are applied to Equation 1, an inspection contrast Ci becomes 94.12%. Since the reference value of the inspection contrast Ci is 90% or more, the thicknesses of the layers of the absorptive pattern (e.g., the 12 nm thickness for the tantalum nitride layer (e.g., the attenuation phase shift layer) and the 23 nm thickness for the aluminum oxide layer (e.g., the anti-reflection layer)) are proper thicknesses.

Referring to FIG. 11B, when the absorptive pattern includes a tantalum nitride layer having a thickness of 12 nm and an aluminum oxide layer having a thickness of 23 nm and a wavelength of the inspection light is 257 nm, an inspection contrast Ci becomes 94.12%.

Referring to FIGS. 11C and 11D, when the absorptive pattern includes a 12 nm tantalum nitride layer and a 23 nm aluminum oxide layer, a wavelength of the exposure light is 13.5 nm, and the spacer is located between the substrate and the reflective layer, the thicknesses of the spacer at which the reflectance ratio ($R_{2E}/R_{1E}$) for the exposure light is 0.1 or less and a phase shift value ($\Delta\phi_E$) is 1800 are 5 nm, 11.8 nm, 18.53 nm, 25.33 nm, and 32.13 nm.

Among the thicknesses of the spacer 30, a maximum thickness of the spacer 30 is 32.13 nm. The maximum thickness of the spacer 30 satisfies that the sum of the thicknesses of the tantalum nitride layer (12 nm) and the aluminum oxide layer (23 nm) of the absorptive pattern may be equal to or less than 35 nm. Accordingly, a height difference between the absorptive and reflective stacks is only 2.87 nm and thus the shadow effect may be significantly reduced.

Therefore, the reflective stack is sequentially stacked by a 32.13 nm silicon layer (e.g., a spacer), a reflective layer having 40 pairs of Mo and Si layers plus another uppermost Si layer, and a 2 nm ruthenium layer (e.g., a capping layer), and when the absorptive stack is sequentially stacked by a reflective layer having 40 pairs of Mo and Si layers plus another uppermost Si layer, a 2 nm ruthenium layer (e.g., a capping layer), a 12 nm tantalum nitride layer (e.g., an attenuation phase shift layer), and a 23 nm aluminum oxide layer (e.g., an anti-reflection layer), i) the phase shift value ($\Delta\phi_E$) for the exposure light may be 180°, ii), the reflectance ratio ($R_{2E}/R_{1E}$) for the exposure light may be 0.1 or less, and iii) the inspection contrast (Ci) may be 90% or more. Therefore, the thicknesses of the layers of the reflective photomask may be determined or optimized.

Alternatively, when the spacer 30 is inserted in the reflective layer, e.g., when the spacer 30 is inserted in a lower portion of the 20$^{th}$ pair of the 40 pairs of Mo and Si layers or the 30$^{th}$ pair of the 40 pairs of Mo and Si layers, a similar result may also be obtained.

Figure 12A:
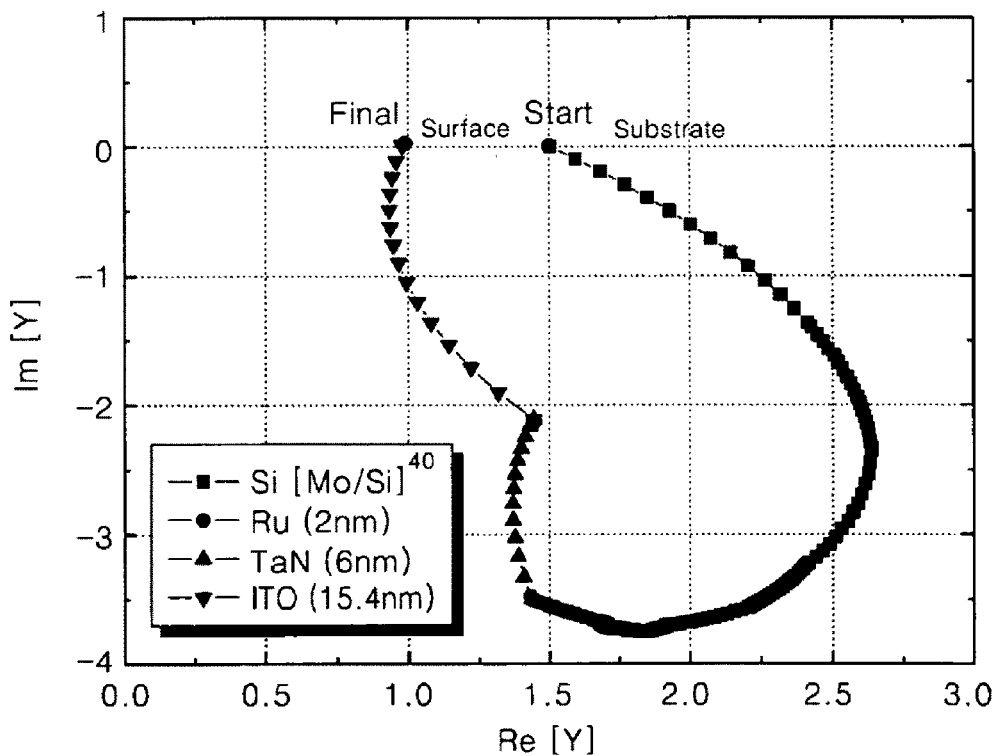
FIGS. 12A through 12D are graphs associated with a method of determining or optimizing thicknesses of layers of a reflective photomask, according to an example embodiment.
Figure 12B:
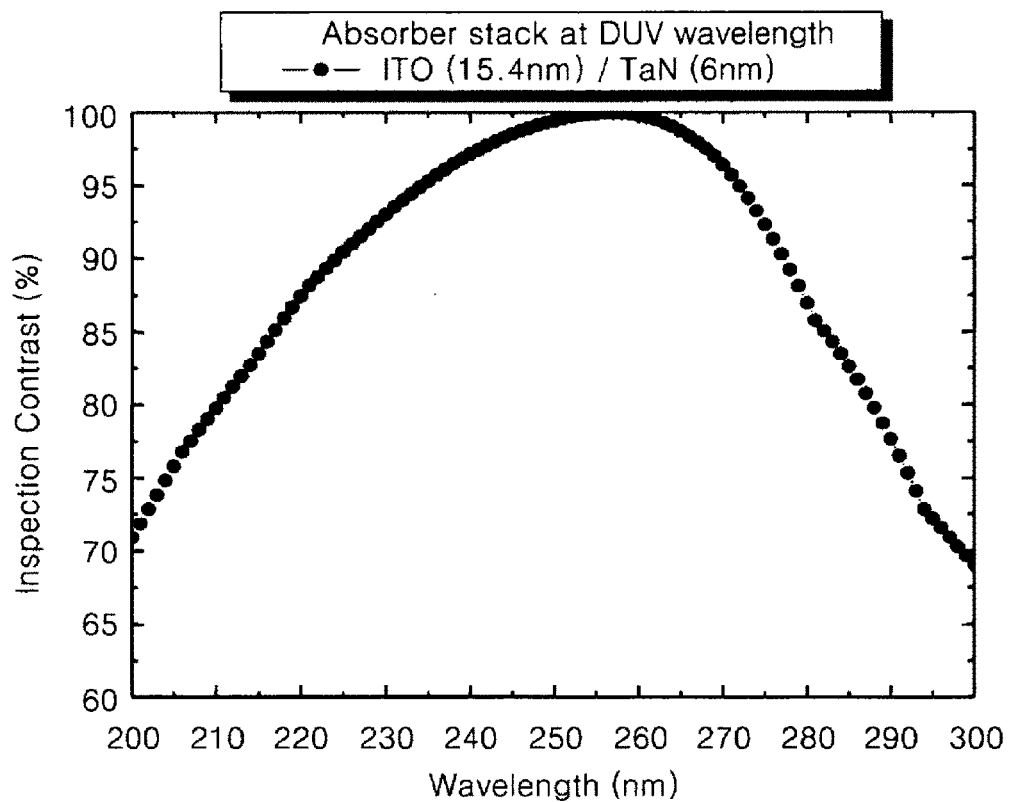
Figure 12C:
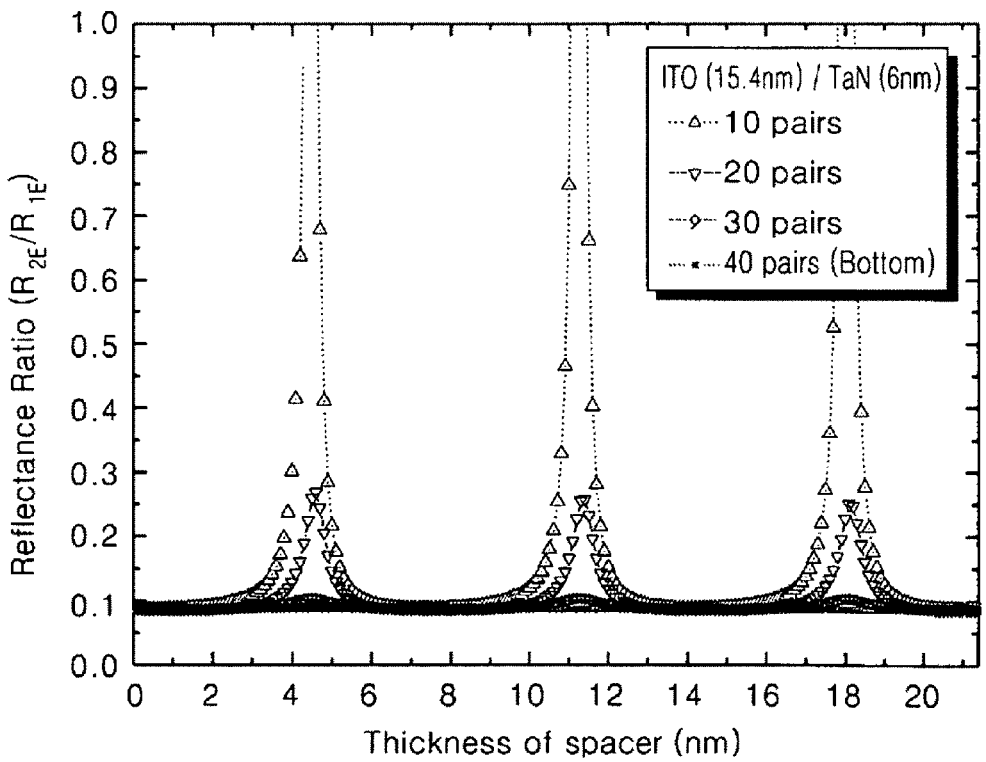
Figure 12D:
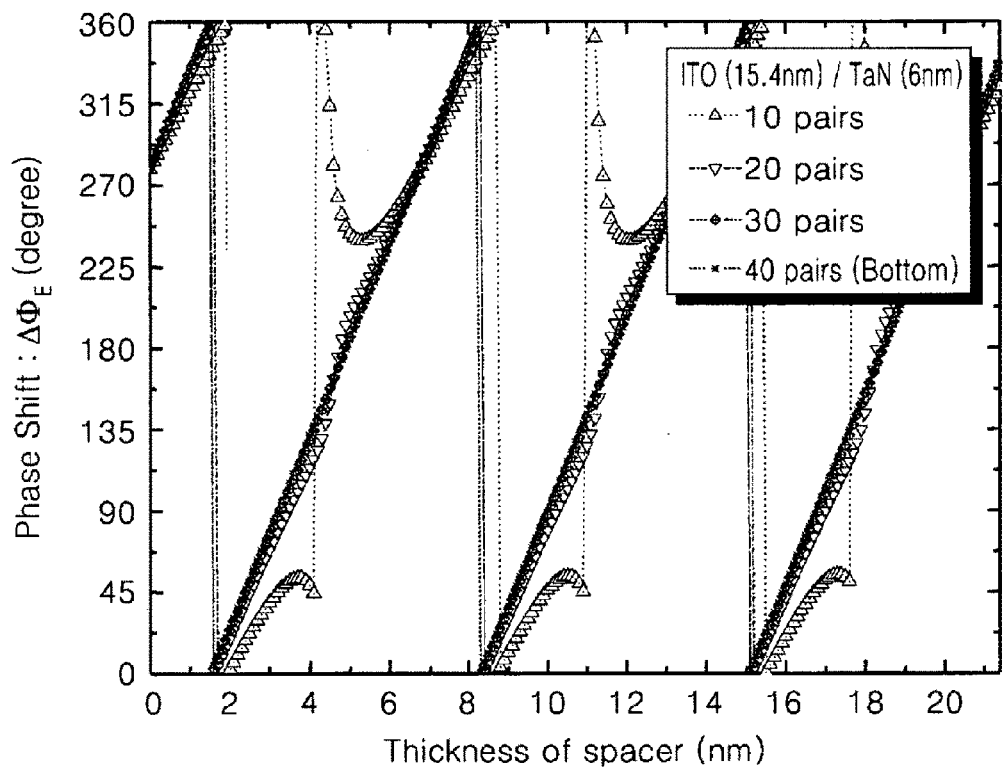

FIGS. 12A through 12D are graphs associated with a method of determining or optimizing thicknesses of layers of a reflective photomask, according to an example embodiment. Specifically, FIG. 12A is a graph of another example of the admittance diagram of the absorptive stack for the inspection light. FIG. 12B is a graph of an example of the inspection contrast in accordance with the wavelength of the inspection light. FIG. 12C is a graph of an example of the reflectance ratio ($R_{2E}/R_{1E}$) for the exposure light in accordance with the thickness of the spacer. FIG. 12D is a graph of an example of the phase shift value ($\Delta\phi_E$) in accordance with the thickness of the spacer.

Referring to FIG. 12A, the surface admittance value of the absorptive stack is (0.980, 0.006) when a wavelength of the inspection light is 257 nm and the absorptive stack includes a reflective layer formed with 40 pairs of Mo and Si layers and another uppermost Si layer, a 2 nm ruthenium layer (e.g., a capping layer), a 16 nm tantalum nitride layer (e.g., an attenuation phase shift layer), and a 15.4 nm indium tin oxide layer (e.g., an anti-reflection layer), which are stacked on a substrate in this order. When the surface admittance value of the absorptive stack is applied to Equation 2, the reflectance $R_{2D}$ of the absorptive stack for the inspection light becomes 0.02%.

Further, the reflectance $R_{1D}$ of the reflective stack for the inspection light becomes 68.4% regardless of the location or thickness of the spacer, when the reflective stack includes, on a substrate, a reflective layer formed with 40 pairs of Mo and Si layers and another uppermost Si layer, a 2 nm ruthenium layer (e.g., a capping layer), and a silicon layer (e.g., a spacer) formed between the substrate and the capping layer, and a wavelength of the inspection light is 257 nm.

When the reflectance $R_{2D}$ (0.02%) of the absorptive stack and the reflectance $R_{1D}$ (68.4%) of the reflective stack are applied to Equation 1, the inspection contrast Ci becomes 99.9%. Since the reference value of the inspection contrast Ci is 90% or more, the thicknesses of the layers of the absorptive pattern (e.g., the 6 nm thickness for the tantalum nitride layer (e.g., the attenuation phase shift layer) and the 15.4 nm thickness for the indium tin oxide layer (e.g., the anti-reflection layer)) are proper thicknesses.

Referring to FIG. 12B, when the absorptive pattern includes a 6 nm tantalum nitride layer and a 15.4 nm indium tin oxide layer and a wavelength of the inspection light is 257 nm, the inspection contrast Ci becomes 99.9%.

Referring to FIGS. 12C and 12D, when the absorptive pattern includes a 6 nm tantalum nitride layer and a 15.4 nm indium tin oxide layer, a wavelength of the exposure light is 13.5 nm, and the spacer is located between the substrate and the reflective layer, the thicknesses of the spacer are 4.9 nm, 11.7 nm, and 18.46 nm. Correspondingly, the reflectance ratio ($R_{2E}/R_{1E}$) for the exposure light is 0.1 or less and the phase shift value ($\Delta\phi_E$) is 180°.

Among the thicknesses of the spacer, a maximum thickness of the spacer is 18.46 nm. The maximum thickness of the spacer satisfies the condition that the sum of the thicknesses of the tantalum nitride layer (6 nm) and the indium tin oxide layer (15.4 nm) of the absorptive pattern may be equal to or less than 21.4 nm. Accordingly, a height difference between the absorptive and reflective stacks is 2.94 nm and thus the shadow effect may be significantly reduced.

Therefore, when the reflective stack is sequentially stacked by a 18.46 nm silicon layer (e.g., a spacer), a reflective layer having 40 pairs of Mo and Si layers plus another uppermost Si layer, and a 2 nm ruthenium layer (e.g., a capping layer), and when the absorptive stack is sequentially stacked by a reflective layer having 40 pairs of Mo and Si layers plus another uppermost Si layer, a 2 nm ruthenium layer (e.g., a capping layer), a 6 nm tantalum nitride layer (e.g., an attenuation phase shift layer), and a 15.4 nm indium tin oxide layer (e.g., an anti-reflection layer), i) the phase shift value ($\Delta\phi_E$) for the exposure light may be 180°, ii), the reflectance ratio ($R_{2E}/R_{1E}$) for the exposure light may be 0.1 or less, and iii) the inspection contrast (Ci) may be 90% or more. Therefore, the thicknesses of the layers of the reflective photomask may be determined or optimized.

Alternatively, when the spacer is inserted in the reflective layer, for example, when the spacer is inserted in a lower portion of the 20$^{th}$ pair of the 40 pairs of Mo and Si layers or the 30$^{th}$ pair of the 40 pairs of Mo and Si layers, a similar result may be obtained.

Figure 13A:
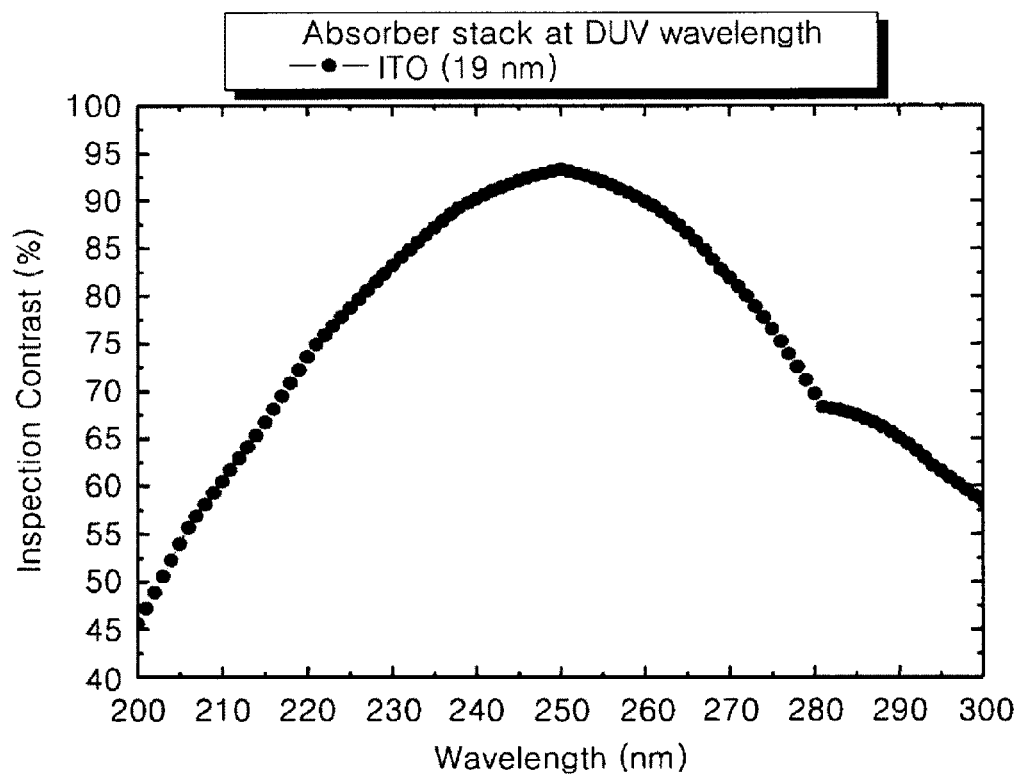
FIGS. 13A through 13C are graphs associated with a method of determining or optimizing thicknesses of layers of a reflective photomask, according to an example embodiment.
Figure 13B:
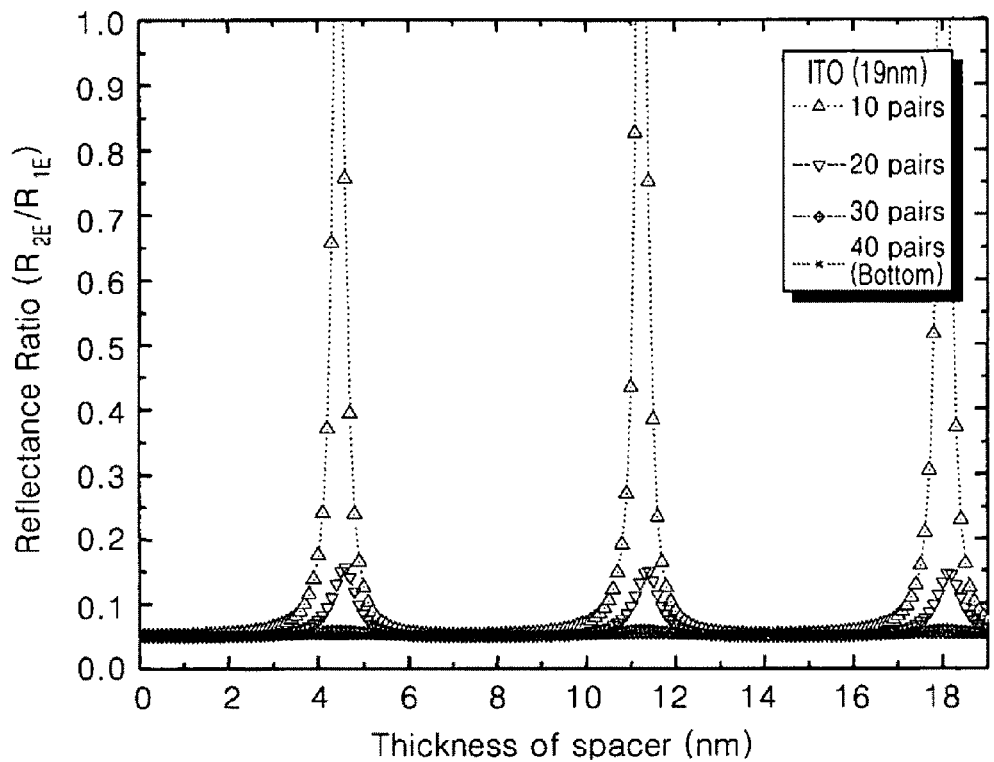
Figure 13C:
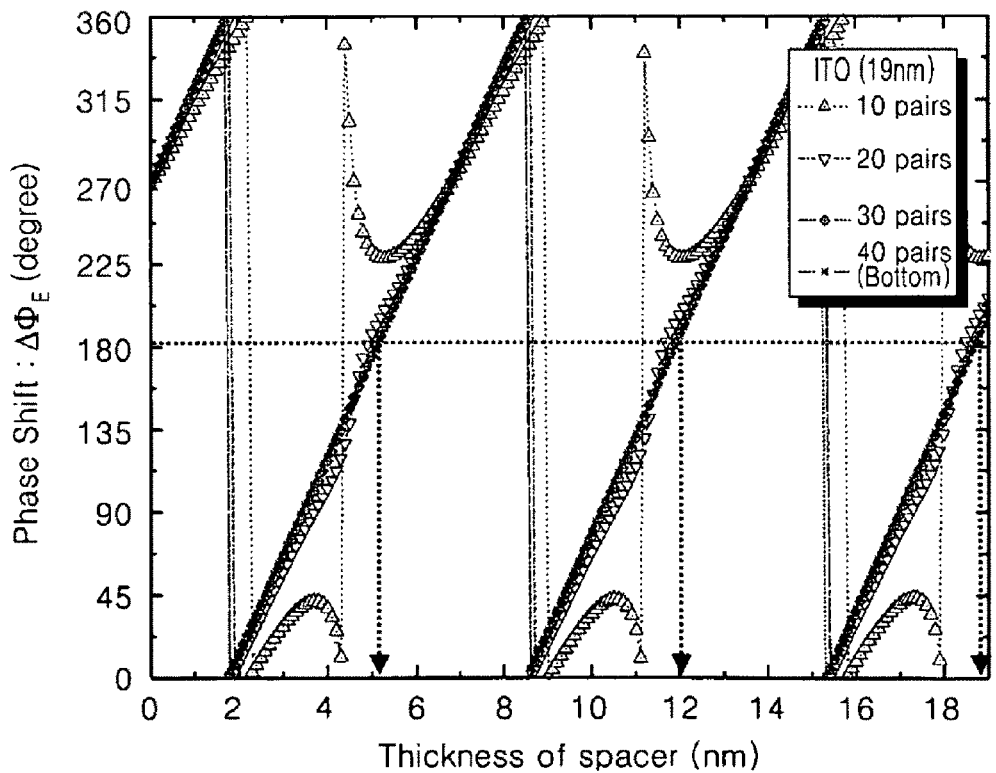

FIGS. 13A through 13C are graphs associated with a method of determining or optimizing thicknesses of layers of a reflective photomask, according to an example embodiment. Specifically, FIG. 13A is a graph of an example of the inspection contrast in accordance with the wavelength of the inspection light. FIG. 13B is a graph of an example of the reflectance ratio ($R_{2E}/R_{1E}$) for the exposure light in accordance with the thickness of the spacer. FIG. 13C is a graph of an example of the phase shift value ($\Delta\phi_E$) in accordance with the thickness of the spacer.

Referring to FIG. 13A, when the absorptive pattern includes an indium tin oxide layer having a thickness of 19 nm and a wavelength of the inspection light is 257 nm, the inspection contrast Ci becomes 91.3%.

Referring to FIGS. 13B and 13C, when the absorptive pattern includes an indium tin oxide layer having a 19 nm thickness, a wavelength of the exposure light is 13.5 nm, and the spacer is located between the substrate and the reflective layer, the thicknesses of the spacer are 5.13 nm, 11.93 nm, and 18.67 nm. Correspondingly, the reflectance ratio ($R_{2E}/R_{1E}$) for the exposure light is 0.1 or less and the phase shift value ($\Delta\phi_E$) is 180°.

Among the thicknesses of the spacer, a maximum thickness of the spacer is 18.67 nm. The maximum thickness of the spacer satisfies the condition that the thickness of the indium tin oxide layer may be equal to or less than 19 nm. Accordingly, a height difference between the absorptive and reflective stacks is 0.33 nm and thus the shadow effect may be significantly reduced.

Therefore, when the reflective stack is sequentially stacked by a 18.67 nm silicon layer (e.g., a spacer), a reflective layer having 40 pairs of Mo and Si layers plus another uppermost Si layer, and a 2 nm ruthenium layer (e.g., a capping layer), and when the absorptive stack is sequentially stacked by a reflective layer having 40 pairs of Mo and Si layers plus another uppermost Si layer, a 2 nm ruthenium layer (e.g., a capping layer), an attenuation phase shift layer, and a 19 nm indium tin oxide layer (e.g., an anti-reflection layer), i) the phase shift value ($\Delta\phi_E$) for the exposure light may be 180°, ii), the reflectance ratio ($R_{2E}/R_{1E}$) for the exposure light may be 0.1 or less, and iii) the inspection contrast (Ci) may be 90% or more. Therefore, the thicknesses of the layers of the reflective photomask may be determined or optimized.

Alternatively, when the spacer is inserted in the reflective layer, for example, when the spacer is inserted in a lower portion of the 20$^{th}$ pair of the 40 pairs of Mo and Si layers or the 30$^{th}$ pair of the 40 pairs of Mo and Si layers, a similar result may be obtained.

Figure 14A:
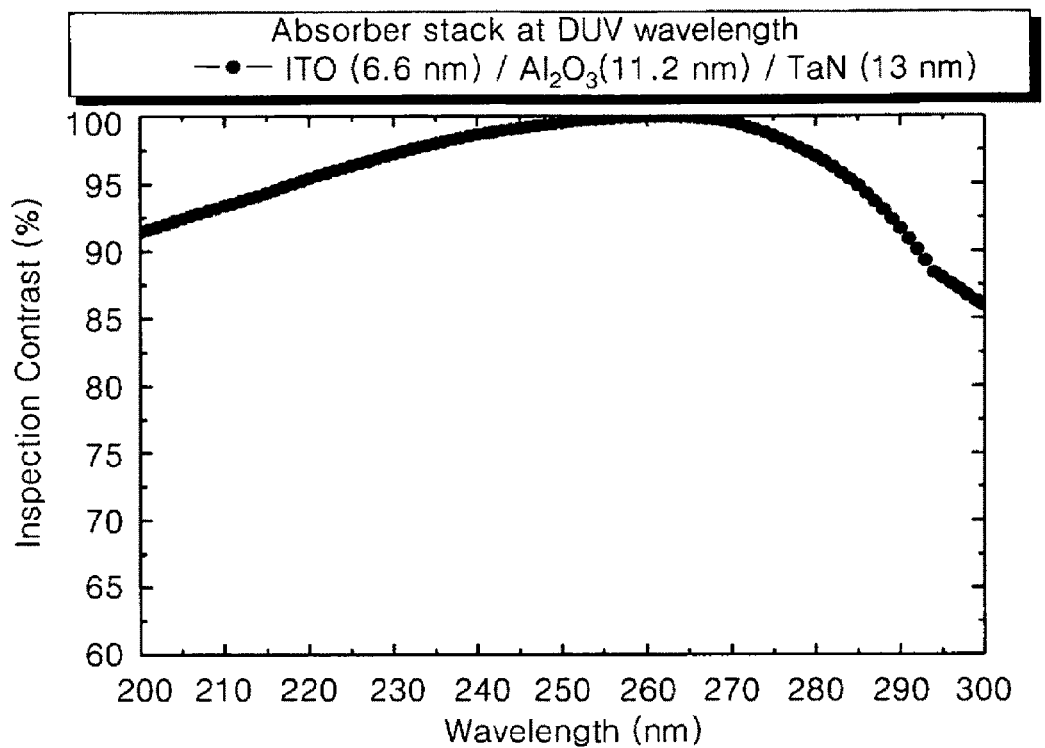
FIGS. 14A through 14C are graphs associated with a method of determining or optimizing thicknesses of layers of a reflective photomask, according to an example embodiment.
Figure 14B:
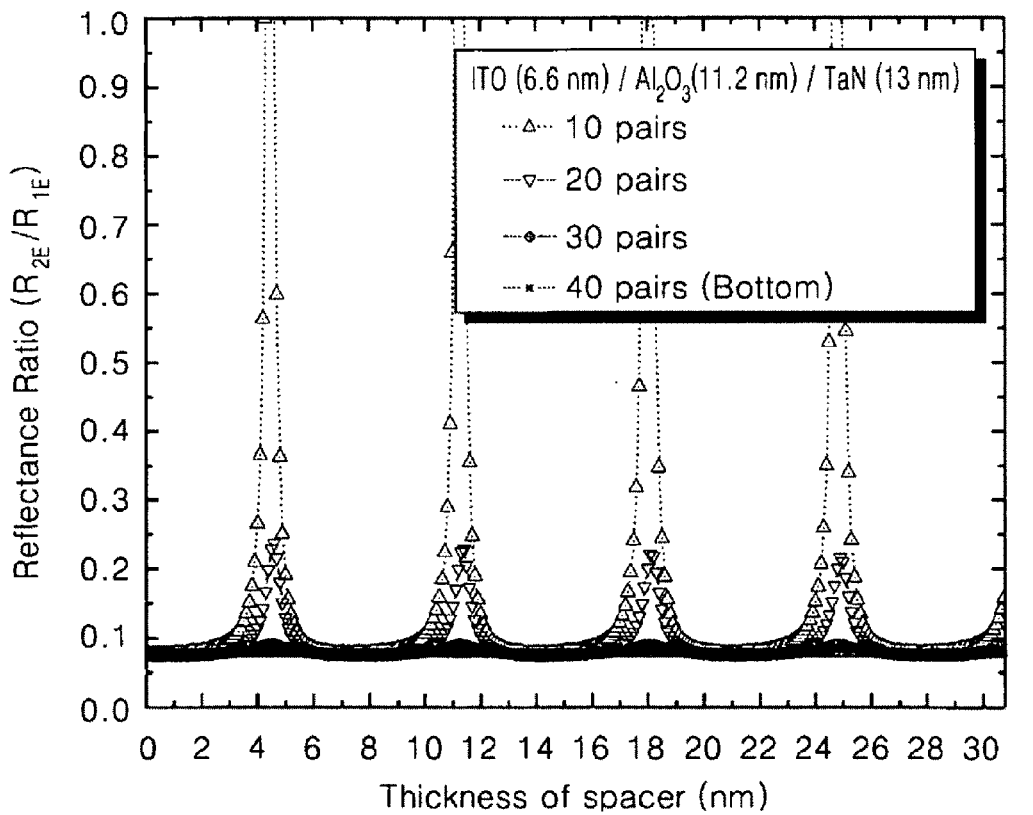
Figure 14C:
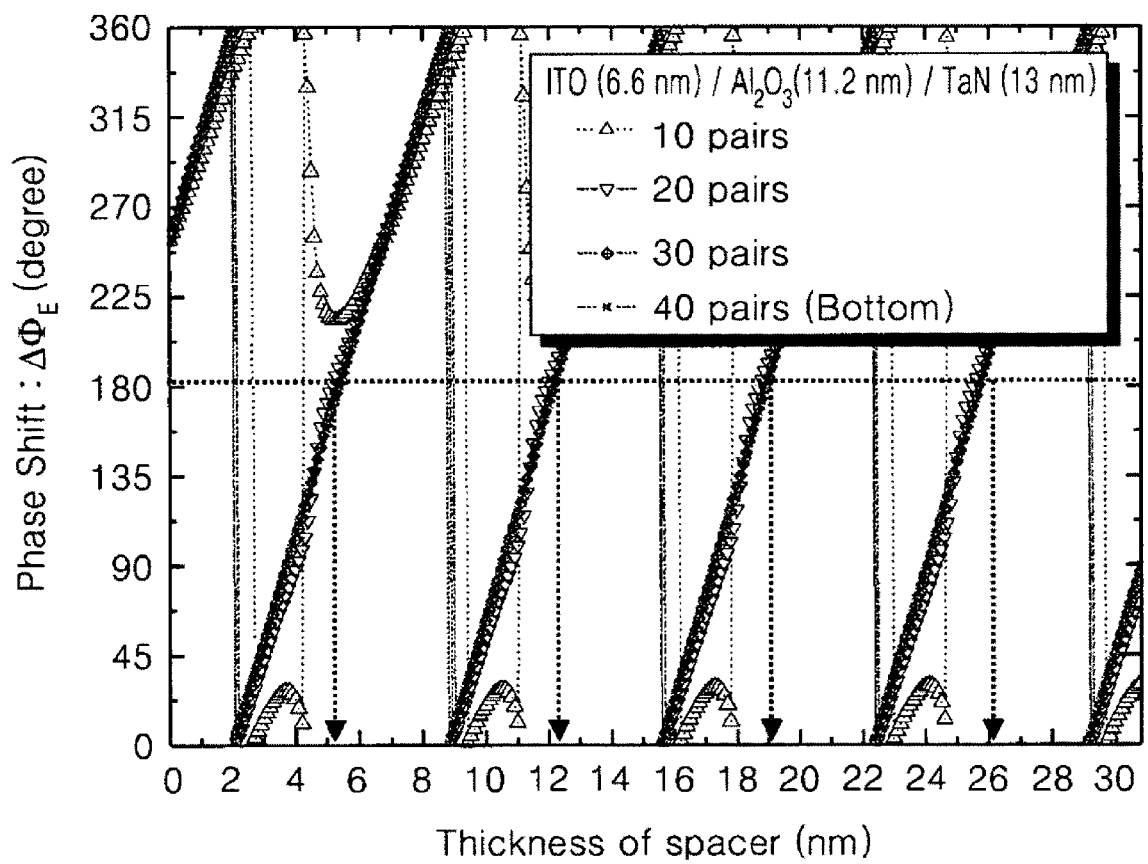

FIGS. 14A through 14C are graphs associated with a method of determining or optimizing thicknesses of layers of a reflective photomask, according to an example embodiment. Specifically, FIG. 14A is a graph of an example of the inspection contrast in accordance with the wavelength of the inspection light. FIG. 14B is a graph of an example of the reflectance ratio ($R_{2E}/R_{1E}$) for the exposure light in accordance with the thickness of the spacer. FIG. 14C is a graph of an example of the phase shift value ($\Delta\phi_E$) in accordance with the thickness of the spacer.

Referring to FIG. 14A, when the absorptive pattern includes a 13 nm tantalum nitride layer, a 11.2 nm aluminum oxide layer, and a 6.6 nm indium tin oxide layer, and a wavelength of the inspection light is 257 nm, the inspection contrast Ci becomes 99.9%.

Referring to FIGS. 14B and 14C, when the absorptive pattern includes a 13 nm tantalum nitride layer, a 11.2 nm aluminum oxide layer, and a 6.6 nm indium tin oxide layer and a wavelength of the exposure light is 257 nm, and the spacer is located between the substrate and the reflective layer, the thicknesses of the spacer are 5.4 nm, 12.2 nm, 19 nm, and 25.72 nm. Correspondingly, the reflectance ratio ($R_{2E}/R_{1E}$) for the exposure light is 0.1 or less and the phase shift value ($\Delta\phi_E$) is 1800.

Among the thicknesses of the spacer, a maximum thickness of the spacer is 25.72 nm. The maximum thickness of the spacer satisfies the condition that the sum of the thicknesses of the tantalum nitride layer (13 nm), the aluminum oxide layer (11.2 nm) and the indium tin oxide layer (6.6 nm) may be equal to or less than 30.8 nm. Accordingly, a height difference between the absorptive and reflective stacks is 5.08 nm and thus the shadow effect may be significantly reduced.

Therefore, when the reflective stack is sequentially stacked by a 25.72 nm silicon layer (e.g., a spacer), a reflective layer having 40 pairs of Mo and Si layers plus another uppermost Si layer, and a 2 nm ruthenium layer (e.g., a capping layer), and when the absorptive stack is sequentially stacked by a reflective layer having 40 pairs of Mo and Si layers plus another uppermost Si layer, a 2 nm ruthenium layer (e.g., a capping layer), a 13 nm tantalum nitride layer (e.g., an attenuation phase shift layer), a 11.2 nm aluminum oxide layer (e.g., an anti-reflection layer), and a 6.6 nm indium tin oxide layer (e.g., an anti-reflection layer), i) the phase shift value ($\Delta\phi_E$) for the exposure light may be 180°, ii), the reflectance ratio ($R_{2E}/R_{1E}$) for the exposure light may be 0.1 or less, and iii) the inspection contrast (Ci) may be 90% or more. Therefore, the thicknesses of the layers of the reflective photomask may be determined or optimized.

Alternatively, when the spacer is inserted in the reflective layer, for example, when the spacer is inserted in a lower portion of the 20$^{th}$ pair of the 40 pairs of Mo and Si layers or the 30$^{th}$ pair of the 40 pairs of Mo and Si layers, a similar result may be obtained.

Figure 15:
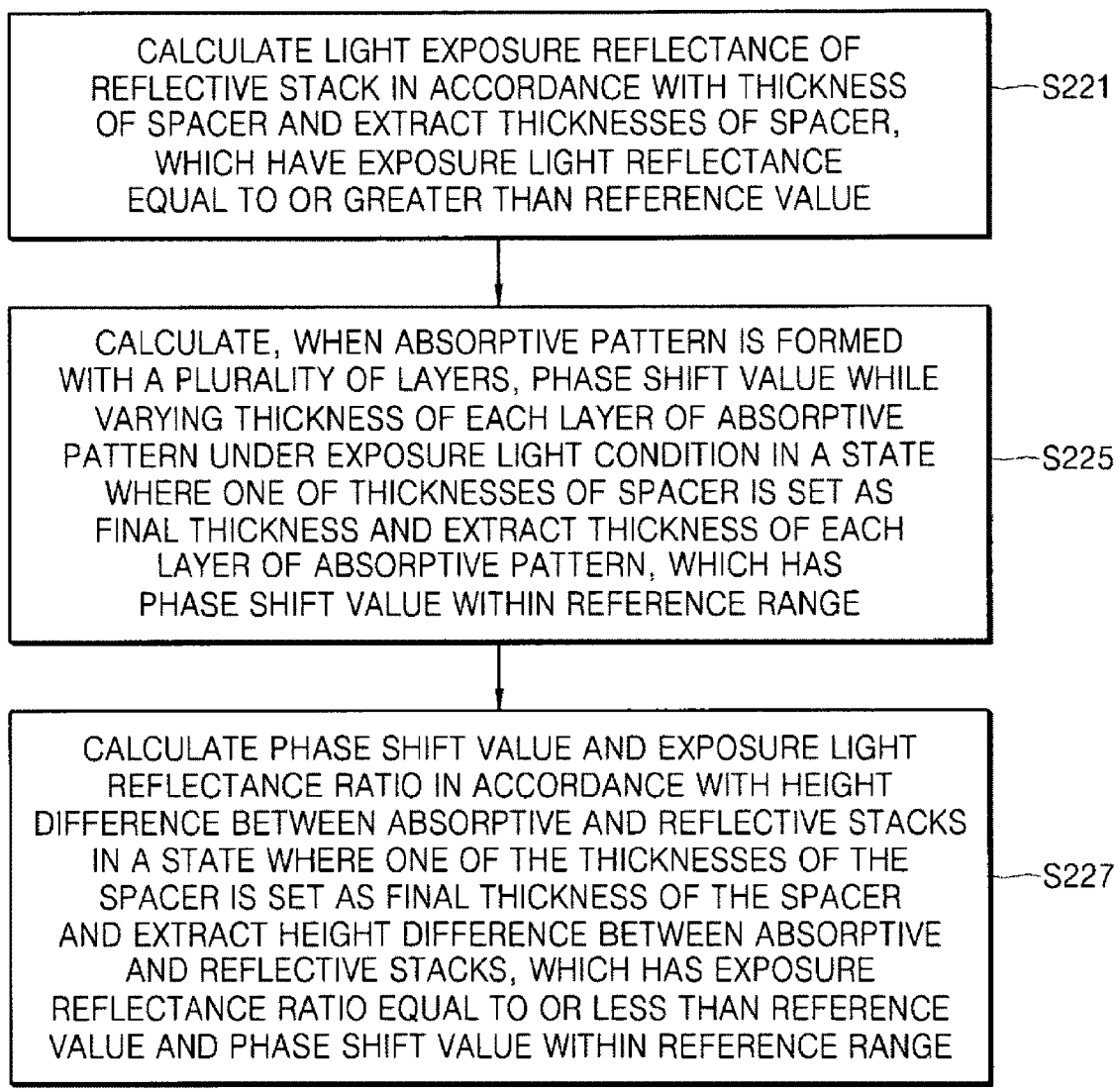
FIG. 15 is a flowchart of a method of determining or optimizing thicknesses of layers of a reflective photomask, according to an example embodiment.

FIG. 15 is a flowchart of a method of determining or optimizing thicknesses of layers of a reflective photomask, according to an example embodiment. Particularly, FIG. 15 illustrates a method of determining or optimizing the thicknesses of the absorptive pattern and spacer of one of the reflective photomasks of FIGS. 2 and 5 through 9. The method of example embodiment may be applied to a case where the spacer is inserted in the reflective layer, located beneath the reflective layer, or located on top of the reflective layer. For example, the method of example embodiment may be applied to the case where the spacer is inserted in the reflective layer or located beneath the reflective layer. For convenience, the method will be described with reference to the reflective photomask of FIG. 9.

Referring to FIGS. 9 and 15, a plurality of reflectance $R_{1E}$ of the reflective stack RS with respect to the exposure light may first be obtained. The plurality of reflectance $R_{1E}$ may be obtained in accordance with a plurality of thicknesses of the spacer 30, respectively. Subsequently, reflectance values greater than a reference value and the corresponding thickness values may be extracted (S221). The reference value of the reflectance $R_{1E}$ may be a reflectance value with respect to the exposure light and may be 70%. One of the extracted thicknesses of the spacer 30 may be selected as a final thickness of the spacer 30. For example, the largest extracted thicknesses of the spacer 30 may be selected as the final thickness of the spacer 30.

Next, if the absorptive pattern 50 has multiple layers, then a set of thickness values for each layer of the absorptive pattern 50 may be obtained. Phase shift values ($\Delta\phi_E$) may be calculated in accordance with a plurality of sets of layer thicknesses of the absorptive pattern 50, based on the selected final thickness of the spacer 30. Then those sets of the layer thicknesses of the absorptive pattern 50 that have phase shift values within a reference range may be extracted (S225). For example, the reference range of the phase shift value ($\Delta\phi_E$) may be 180±5°. One of the extracted set of the layer thicknesses may be selected as a final set of the thicknesses of the absorptive pattern 50. For example, a set of the thicknesses, which is most approximate to the phase shift value of 180°, may be selected as the final set of the absorptive pattern 50. If the absorptive pattern 50 is formed with a single layer, the above-described process may be omitted.

Then, a reflectance ratio and a phase shift value may be extracted (S227) in accordance with a height difference ($H_{SA}$–$H_{SR}$) between the absorptive and reflective stacks AS and RS, based on the selected thickness of the spacer 30 and a height difference between the absorptive and reflective stacks AS and RS. The exposure light reflection ratio of the absorptive and reflective stacks AS and RS may be less than the reference value and a phase shift value within the reference range. If the absorptive pattern 50 is formed with the single layer, the exposure light reflection ratio and the phase shift value in accordance with the thickness of the absorptive pattern 50 may be calculated instead of the height difference between the absorptive and reflective stacks AS and RS. Then the thicknesses of the absorptive pattern, which have the exposure light reflection ratio less than the reference value and the phase shift value within the reference range, may be extracted.

Figure 16A:
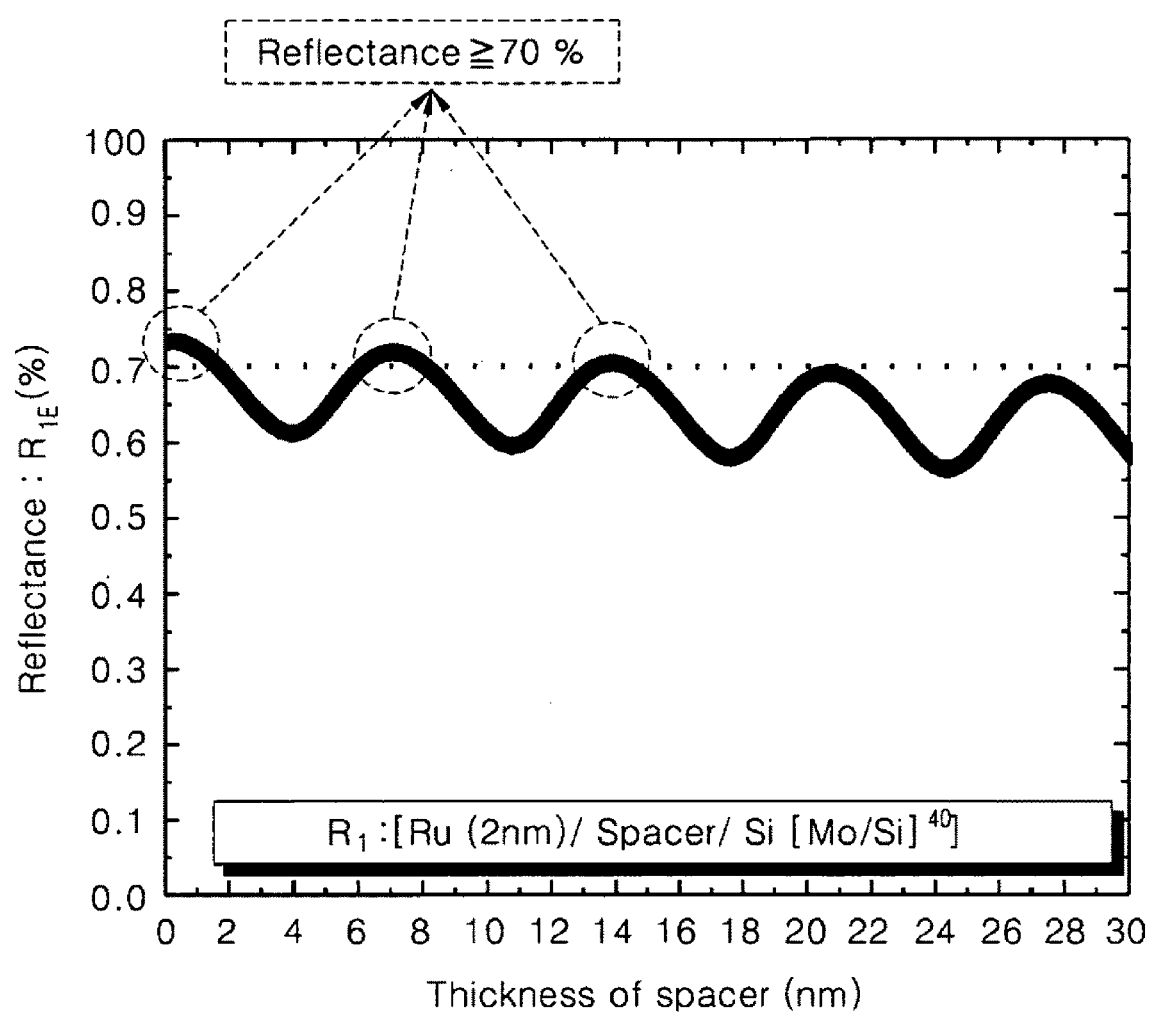
FIGS. 16A through 16D are graphs associated with a method of determining or optimizing thicknesses of layers of a reflective photomask, according to an example embodiment.
Figure 16B:
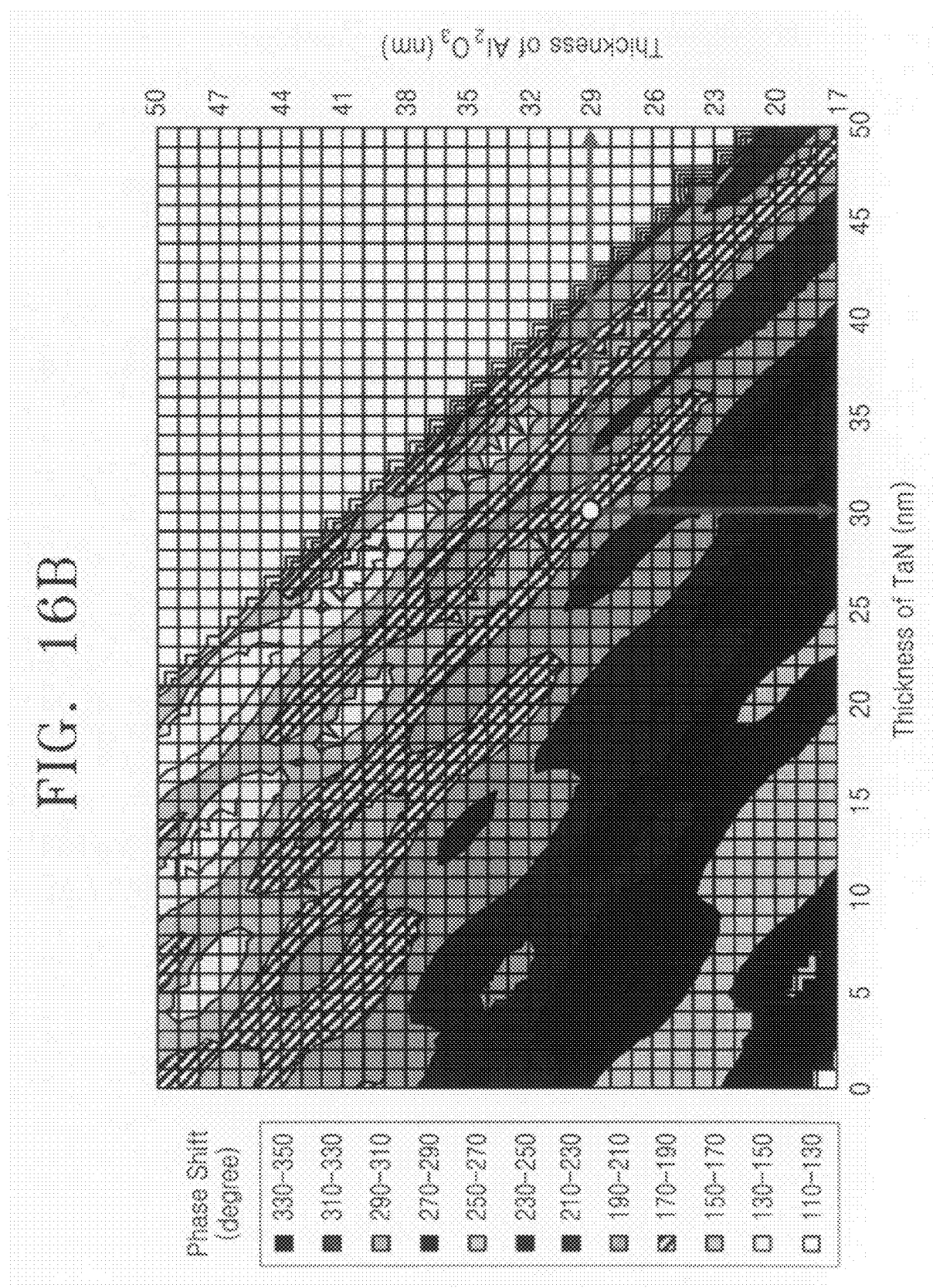
Figure 16C:
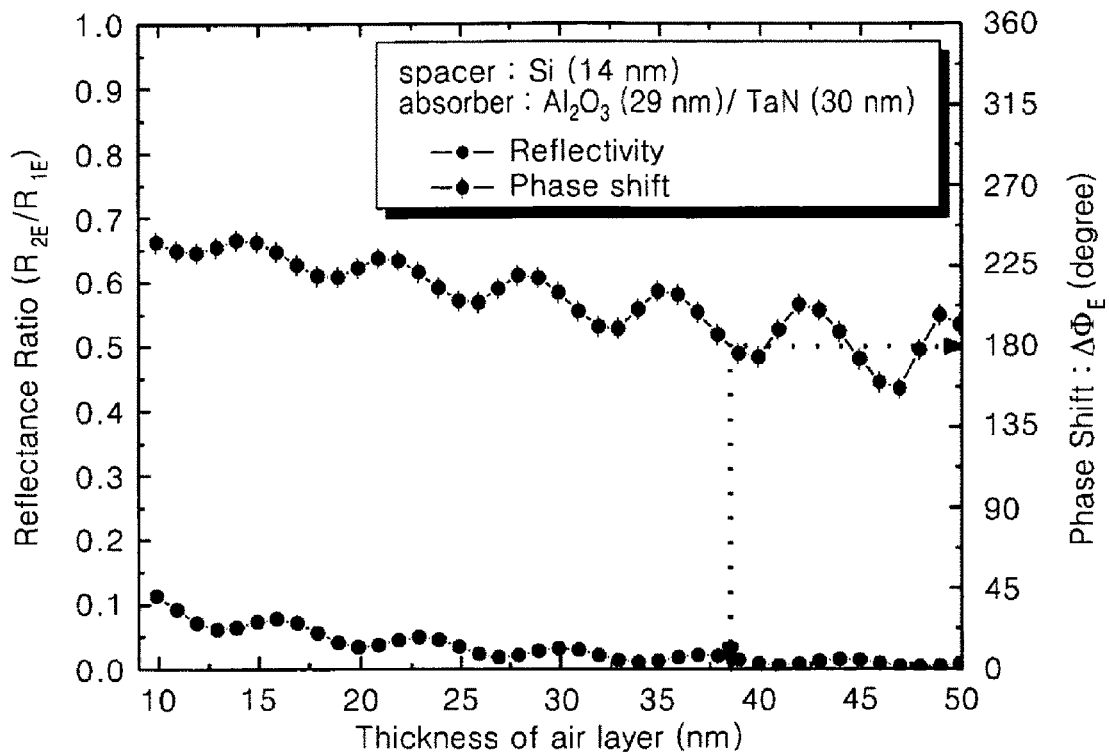
Figure 16D:
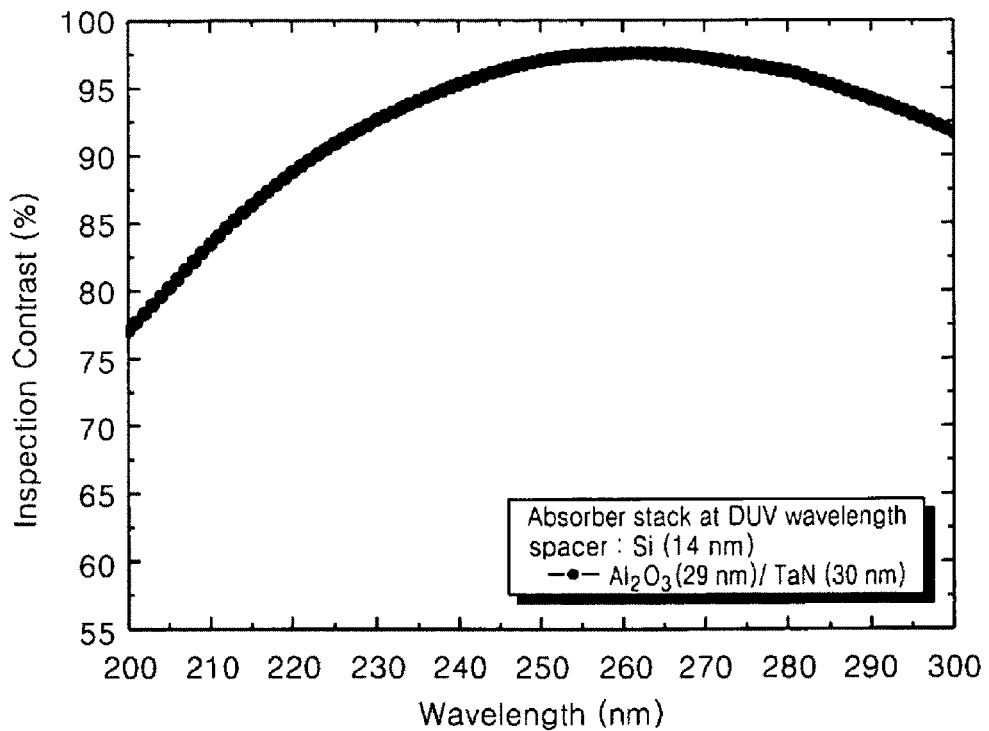

FIGS. 16A through 16D are graphs associated with a method of determining or optimizing thicknesses of layers of a reflective photomask, according to an example embodiment. FIG. 16A is an example graph of an exposure light reflectance ratio of the reflective stack in accordance with a thickness of the spacer. FIG. 16B is a contour map illustrating a phase shift value in accordance with the thicknesses of layers of the absorptive pattern under an exposure light condition. FIG. 16C is an example graph of an exposure light reflectance ratio and a phase shift value in accordance with a height difference between the absorptive and reflective stacks. FIG. 16D is an example graph of an inspection contrast in accordance with the wavelength of the inspection light.

Referring to FIG. 16A, when the reflective stack includes a reflective layer formed with 40 pairs of Mo and Si layers and another uppermost Si layer, a spacer, and a 2 nm ruthenium layer (e.g., a capping layer), and when a wavelength of the inspection light is 13.5 nm, the thickness values of the spacer that make the reflectance $R_{1E}$ 70% or more are 1 nm, 7 nm, and 14 nm. When the thickness of the spacer is selected to be 14 nm, which is the highest value among the thicknesses of the spacer obtained above, a height difference between the absorptive and reflective stacks may be substantially minimized. When the thickness of the spacer is 14 nm, the reflectance $R_{1E}$ becomes 70.46%.

Referring to FIG. 16B, when the thickness of the spacer is 14 nm, the absorptive pattern includes a tantalum nitride layer (e.g., an attenuation phase shift layer) and an aluminum oxide layer (e.g., an anti-reflection layer), and when the wavelength of the exposure light is 13.5 nm, thicknesses of the tantalum nitride layer and the aluminum oxide layer may be 30 nm and 29 nm, respectively, to a phase shift value about 180° (e.g., 181.32°).

Referring to FIG. 16C, when the thickness of the spacer is 14 nm, the absorptive pattern includes a 30 nm tantalum nitride layer and a 29 nm aluminum oxide layer, a height difference between the absorptive and reflective stacks, which have an exposure light reflectance ratio less than 0.1 and a phase shift value of 180°, is 38.9 nm. Layers under the absorptive pattern are eliminated In order to realize the 38.9 nm height difference between the absorptive and reflective stacks of the reflective photomask. Accordingly, the thicknesses of the spacer and absorptive pattern are respectively fixed at 14 nm and 45 nm, as shown in FIG. 9, and the capping layer (2 nm) and a portion of the reflective layer (Si layer of 4.1 nm) are eliminated.

Referring to FIG. 16D, when a thickness of the spacer is 14 nm, the absorptive pattern includes a 30 nm tantalum nitride layer and a 29 nm aluminum oxide layer, and a wavelength of the inspection light is 257 nm, the inspection contrast Ci becomes 97.44%.

Therefore, the reflective stack may include a reflective layer having 40 pairs of Mo and Si layers and another uppermost Si layer, a 4 nm silicon layer (e.g., a spacer), a 2 nm ruthenium layer (e.g., a capping layer). The absorptive stack may include a reflective layer having 40 pairs of Mo and Si layers, a 30 nm tantalum nitride layer (e.g., an attenuation phase shift layer), and a 29 nm aluminum oxide layer (e.g., an anti-reflection layer). The reflective layer and the reflective layer may be stacked on the substrate in the above stated order. Accordingly, i) a phase shift value ($\Delta\phi_E$) for the exposure light may be 180°, ii) a reflectance ratio ($R_{2E}/R_{1E}$) for the exposure light may be 0.1 or less, and iii) an inspection contrast (Ci) may be 90% or more. Therefore, the thicknesses of the layers of the reflective photomask are determined or optimized.

Figure 17A:
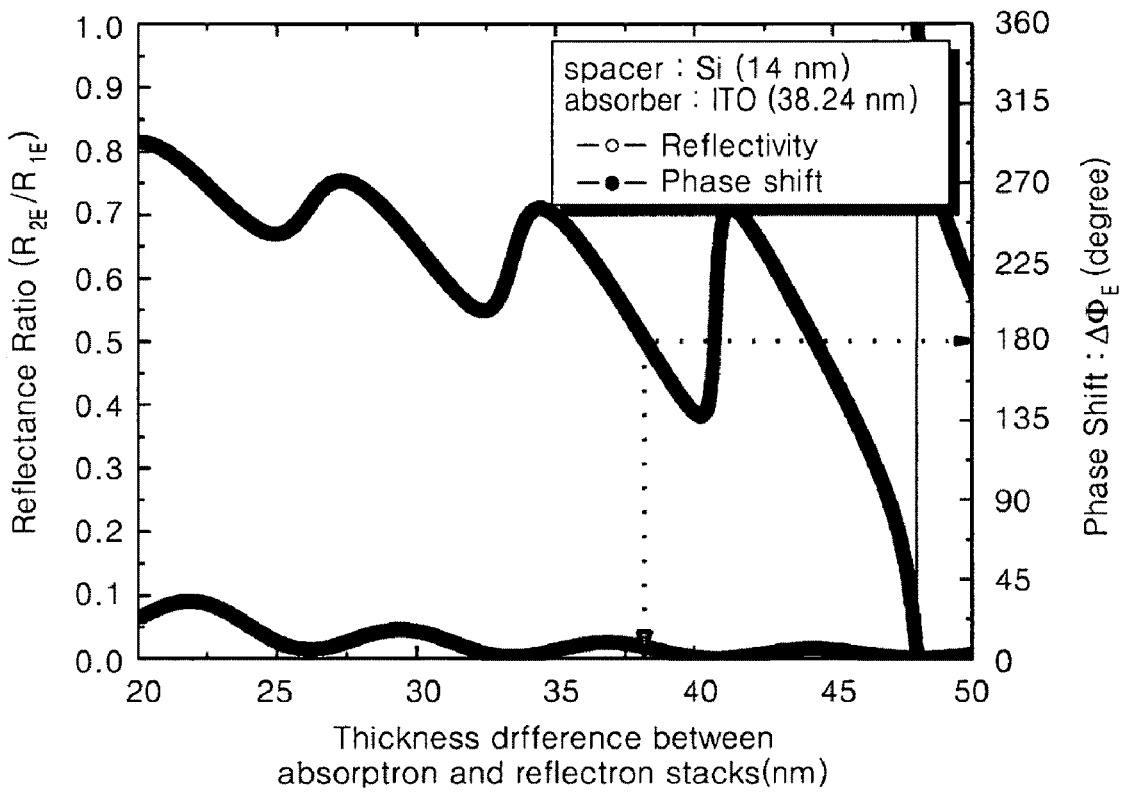
FIGS. 17A and 17B are graphs associated with a method of determining or optimizing thicknesses of layers of a reflective photomask, according to an example embodiment.
Figure 17B:
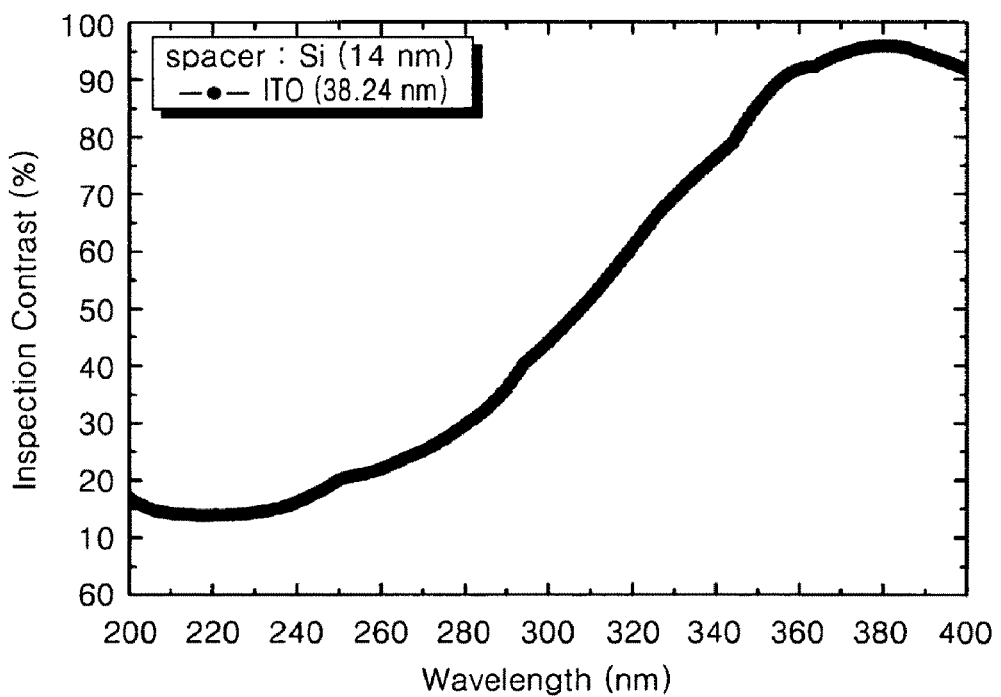

FIGS. 17A and 17B are graphs associated with a method of determining or optimizing thicknesses of layers of a reflective photomask, according to an example embodiment. FIG. 17A is a graph illustrating an exposure light reflectance ratio and phase shift value in accordance with a thickness of the absorptive pattern. FIG. 17B is an example graph of an inspection contrast in accordance with the wavelength of the inspection light.

First, as described with reference to FIG. 16A above, when the reflective stack includes a reflective layer formed with 40 pairs of Mo and Si layers and another uppermost Si layer, a spacer, and a 2 nm ruthenium layer (e.g., a capping layer), and a wavelength of the exposure light is 13.5 nm, the thicknesses of the spacer, at which the reflectance $R_{1E}$ is 70% or more, are 1 nm, 7 nm, and 14 nm. The maximum thickness 14 nm may be selected as a final thickness of the spacer.

Referring to FIG. 17A, when a thickness of the spacer is 14 nm and the absorptive pattern is formed of a single layer of indium tin oxide, the thickness of the indium tin oxide layer, at which the exposure light reflectance ratio is 0.1 or less and the phase shift value is about 180°, is 38.24 nm.

Referring to FIG. 17B, when a thickness of the spacer is 14 nm, the absorptive pattern is an indium tin oxide layer having a thickness of 38.24 nm, and a wavelength of the inspection light is 257 nm, the inspection contrast Ci becomes 92.79%.

Therefore, when the reflective stack includes a reflective layer having 40 pairs of Mo and Si layers plus another uppermost Si layer, a 14 nm silicon layer (e.g., a spacer), a 2 nm ruthenium layer (e.g., a capping layer), when the absorptive stack includes a reflective layer having 40 pairs of Mo and Si layers and a 38.24 nm indium tin oxide layer (e.g., an absorptive pattern), and when the reflective stack and the absorptive stack are stacked on the substrate in the above stated order, i) a phase shift value ($\Delta\phi_E$) for the exposure light may be 1800, ii), a reflectance ratio ($R_{2E}/R_{1E}$) for the exposure light may be 0.1 or less, and iii) an inspection contrast (Ci) may be 90% or more. Accordingly, the thicknesses of the layers of the reflective photomask may be determined or optimized.

According to example embodiments, since the spacer is provided to the reflective region, a shadow effect caused by an absorptive pattern may be reduced by reducing a height difference between the absorptive and reflective stacks.

In addition, by adjusting the location and thickness of the spacer, the reflectance of the reflective stack and the phase of the light reflected from the reflective stack may be tuned.

Furthermore, as the thickness of layers of the reflective photomask may be substantially optimized, a substantially 180° phase shift for the exposure light, an 0.1 or less exposure light reflectance ratio, and an inspection contrast that is 90% or more may be obtained.

While example embodiments have been particularly shown and described with reference to FIGS. 2-17B, it will be understood by one of ordinary skill in the art that various changes in form and details may be made therein without departing from the spirit and scope of example embodiments as defined by the following claims.

What is claimed is:

1. A reflective photomask, comprising:
a substrate including a reflective region and an absorptive region;
a reflective layer on the reflective and absorptive regions;
an absorptive pattern, above the absorptive region, on the reflective layer; and
a spacer, above the reflective region, on the reflective layer, in the reflective layer, or under the reflective layer.

2. The reflective photomask of claim 1, wherein the absorptive pattern includes an attenuation phase shift layer.

3. The reflective photomask of claim 2, wherein the attenuation phase shift layer includes at least one of tantalum, nitrogen, silicon, boron, oxygen, chromium, indium, and tin.

4. The reflective photomask of claim 2, wherein the attenuation phase shift layer includes one of a tantalum nitride layer, a tantalum silicon nitride layer, a tantalum boron nitride layer, a tantalum silicon oxide layer, a chromium oxide layer, a chromium nitride layer, and an indium tin oxide layer.

5. The reflective photomask of claim 2, wherein the absorptive pattern includes an anti-reflection layer on the attenuation phase shift layer.

6. The reflective photomask of claim 5, wherein the anti-reflection layer includes at least one of aluminum, oxygen, indium, and tin.

7. The reflective photomask of claim 5, wherein the anti-reflection layer includes at least one of an aluminum oxide layer and an indium tin oxide layer.

8. The reflective photomask of claim 1, wherein the absorptive pattern includes at least one of tantalum, oxygen, aluminum, indium, and tin.

9. The reflective photomask of claim 1, wherein the absorptive pattern is one of a tantalum oxide layer and aluminum oxide layer pair, a tantalum oxide layer and indium thin oxide layer pair, a tantalum oxide layer, an aluminum oxide layer, an indium tin oxide layer stack, and a single indium tin oxide layer.

10. The reflective photomask of claim 1, wherein the spacer has a thickness that creates a constructive interference between a light reflected from a top surface of the spacer and a light reflected from a bottom surface of the spacer.

11. The reflective photomask of claim 1, wherein the spacer is a silicon layer.

12. The reflective photomask of claim 1, wherein the spacer is on the reflective layer.

13. The reflective photomask of claim 1, further comprising:
a capping layer above the reflective layer.

14. The reflective photomask of claim 13, wherein the capping layer is an uppermost layer above the reflective region, and
wherein the capping layer is between the reflective layer and the absorptive pattern above the absorptive region.

15. The reflective photomask of claim 13, wherein the capping layer includes one of a ruthenium layer, a silicon layer, and a carbon layer.

16. The reflective photomask of claim 1, wherein the reflective layer has a trench above the absorptive region, and
wherein the absorptive pattern is in the trench.

17. A method of determining thicknesses of layers of the reflective photomask of claim 1, the method comprising:
calculating a set of thickness values corresponding to every layer of the absorptive pattern, which has a corresponding inspection contrast value equal to or greater than a first reference value;
calculating a plurality of exposure light reflectance ratios and phase shift values of the absorptive pattern with the set of thickness values, corresponding with a plurality of thicknesses of the spacer;
extracting thicknesses of the spacer from the plurality of thicknesses of the spacer, wherein the corresponding exposure light reflectance ratio is equal to or less than a second reference value and the phase shift value is within a reference range; and
obtaining a maximum thickness from the extracted thicknesses of the spacer that are equal to or less than an overall thickness of the absorptive pattern.

18. The method of claim 17, wherein calculating the set of thickness values corresponding to every layer of the absorptive pattern includes:
setting an arbitrary thickness of each of the layers of the absorptive pattern;
calculating an admittance value on a surface of the absorptive pattern for an inspection light based on the arbitrary thickness of each of the layers of the absorptive pattern;
calculating an inspection contrast value using the calculated admittance value; and
comparing the inspection contrast value with the first reference value.

19. The method of claim 17, wherein the spacer is in the reflective layer or under the reflective layer.

20. A method of determining thicknesses of layers of the reflective photomask of claim 1, the method comprising:
obtaining a plurality of exposure light reflectance ratios of a reflective stack in accordance with a plurality of thicknesses of the spacer;
extracting a final thickness of the spacer from the plurality of thickness of the spacer, so that a corresponding exposure light reflectance ratio is equal to or greater than a reference value; and
obtaining a phase shift value within a reference range and an exposure light reflectance ratio equal to or less than the reference value;
wherein the phase shift value and the exposure light reflectance ratio are in accordance with a height difference between an absorptive stack and the reflective stack.

* * * * *